(12) United States Patent
Ahn

(10) Patent No.: US 12,720,732 B2
(45) Date of Patent: Aug. 25, 2026

(54) SEMICONDUCTOR MEMORY DEVICES HAVING ACTIVE AND ISOLATION PATTERNS

(71) Applicant: Samsung Electronics Co., Ltd., Suwon-si (KR)

(72) Inventor: Junhyeok Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 391 days.

(21) Appl. No.: 18/350,863

(22) Filed: Jul. 12, 2023

(65) Prior Publication Data

US 2024/0196596 A1 Jun. 13, 2024

(30) Foreign Application Priority Data

Dec. 9, 2022 (KR) ........................ 10-2022-0171762

(51) Int. Cl.
*H10B 12/00* (2023.01)

(52) U.S. Cl.
CPC ........... *H10B 12/34* (2023.02); *H10B 12/053* (2023.02); *H10B 12/315* (2023.02)

(58) Field of Classification Search
CPC ...... H10B 12/34; H10B 12/053; H10B 12/30; H10B 12/488; H10D 64/513
See application file for complete search history.

(56) References Cited

U.S. PATENT DOCUMENTS

| | | | |
|---|---|---|---|
| 7,274,060 B2 | 9/2007 | Popp et al. | |
| 7,300,848 B2 | 11/2007 | Jang | |
| 8,324,673 B2 | 12/2012 | Chung et al. | |
| 9,515,022 B2 | 12/2016 | Kwon et al. | |
| 9,608,077 B1 | 3/2017 | Kye et al. | |
| 10,374,087 B2 | 8/2019 | Kim et al. | |
| 10,818,672 B2 | 10/2020 | Lee et al. | |
| 2022/0302123 A1* | 9/2022 | Munetaka | H10D 64/667 |

FOREIGN PATENT DOCUMENTS

| | | |
|---|---|---|
| KR | 10-2014-0028978 A | 3/2014 |
| KR | 10-2015-0091861 A | 8/2015 |

* cited by examiner

*Primary Examiner* — Nelson Garces
(74) *Attorney, Agent, or Firm* — Wolf, Greenfield & Sacks, P.C.

(57) ABSTRACT

A semiconductor memory device may include an active pattern on a substrate and at least partially surrounded by a device isolation pattern, a gate electrode that crosses the active pattern in a first direction parallel to a bottom surface of the substrate, the gate electrode including lower and upper portions, and a side-capping pattern on a top surface of the lower portion of the gate electrode. The side-capping pattern may be on a side surface of the upper portion of the gate electrode, and a top surface of the side-capping pattern may be located at a level lower than an uppermost surface of the device isolation pattern, relative to the bottom surface of the substrate where the bottom surface of the substrate is a base reference layer.

20 Claims, 35 Drawing Sheets

SEMICONDUCTOR MEMORY DEVICES HAVING ACTIVE AND ISOLATION PATTERNS

CROSS-REFERENCE TO RELATED APPLICATIONS

This U.S. non-provisional patent application claims priority under 35 U.S.C. § 119 to Korean Patent Application No. 10-2022-0171762, filed on Dec. 9, 2022, in the Korean Intellectual Property Office, the entire contents of which are hereby incorporated by reference.

BACKGROUND

The present disclosure relates to semiconductors, and in particular, to semiconductor memory devices.

Due to their small-sized, multifunctional, and/or low-cost characteristics, semiconductor devices are regarded as important elements in the electronics industry. The semiconductor devices can be classified into a semiconductor memory device for storing data, a semiconductor logic device for processing data, and a hybrid semiconductor device including both memory and logic elements.

Due to the recent increasing demand for electronic devices with a fast speed and/or low power consumption, the semiconductor device may need a fast operating speed and/or a low operating voltage. To satisfy this, it is necessary to increase an integration density of the semiconductor device. As the integration density of the semiconductor device increases, the electrical and reliability characteristics of the semiconductor device may be deteriorated. Accordingly, many studies are being conducted to improve the electrical and reliability characteristics of the semiconductor device.

SUMMARY

Aspects of the inventive concept provide semiconductor memory devices with improved electrical and reliability characteristics.

According to some embodiments of the inventive concept, a semiconductor memory device may include an active pattern on a substrate and at least partially surrounded by a device isolation pattern, a gate electrode that crosses the active pattern in a first direction parallel to a bottom surface of the substrate, the gate electrode including lower and upper portions, and a side-capping pattern on a top surface of the lower portion of the gate electrode. The side-capping pattern may be on a side surface of the upper portion of the gate electrode. A top surface of the side-capping pattern may be located at a level lower than an uppermost surface of the device isolation pattern, relative to the bottom surface of the substrate where the bottom surface of the substrate is a base reference layer.

According to some embodiments of the inventive concept, a semiconductor memory device may include an active pattern on a substrate and at least partially surrounded by a device isolation pattern, a gate electrode that crosses the active pattern in a first direction parallel to a bottom surface of the substrate, the gate electrode including lower and upper portions, a gate insulating pattern that extends into a space between the gate electrode and the active pattern, and a side-capping pattern between the upper portion of the gate electrode and the gate insulating pattern. A top surface of the side-capping pattern may be located at a level lower than an uppermost surface of the device isolation pattern, relative to the bottom surface of the substrate where the bottom surface of the substrate is a base reference layer.

According to some embodiments of the inventive concept, a semiconductor memory device may include an active pattern on a substrate and at least partially surrounded by a device isolation pattern, a gate electrode that crosses the active pattern in a first direction parallel to a bottom surface of the substrate, the gate electrode including lower and upper portions, a gate capping pattern on a top surface of the upper portion of the gate electrode, and a side-capping pattern on a side surface of the upper portion of the gate electrode. The side-capping pattern may be between the gate capping pattern and the lower portion of the gate electrode. A top surface of the side-capping pattern may be located at a level lower than an uppermost surface of the device isolation pattern, relative to the bottom surface of the substrate where the bottom surface of the substrate is a base reference layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
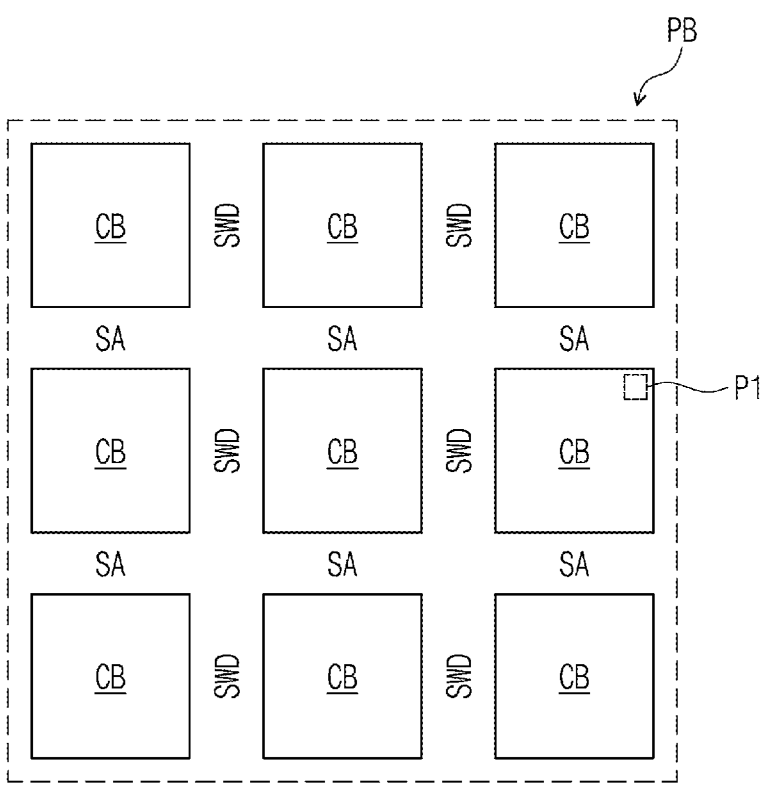
FIG. 1 is a block diagram illustrating a semiconductor memory device according to some embodiments of the inventive concept.
Figure 1:
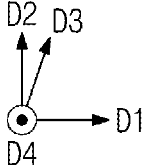

FIG. 1 is a block diagram illustrating a semiconductor memory device according to some embodiments of the inventive concept.

Referring to FIG. 1, a semiconductor memory device may include cell blocks CB and a peripheral block PB, which is provided around each of the cell blocks CB. Each of the cell blocks CB may include a cell circuit, such as a memory integrated circuit. The peripheral block PB may include various peripheral circuits, which are used to operate the cell circuit, and the peripheral circuits may be electrically connected to the cell circuit.

The peripheral block PB may include sense amplifier circuits SA and sub-word line driver circuits SWD. In some embodiments, the sense amplifier circuits SA may be provided to face each other, with the cell blocks CB interposed therebetween, and the sub-word line driver circuits SWD may be provided to face each other, with the cell blocks CB interposed therebetween. The peripheral block PB may further include power and ground circuits for driving a sense amplifier, but the inventive concept is not limited to this example.

Figure 2:
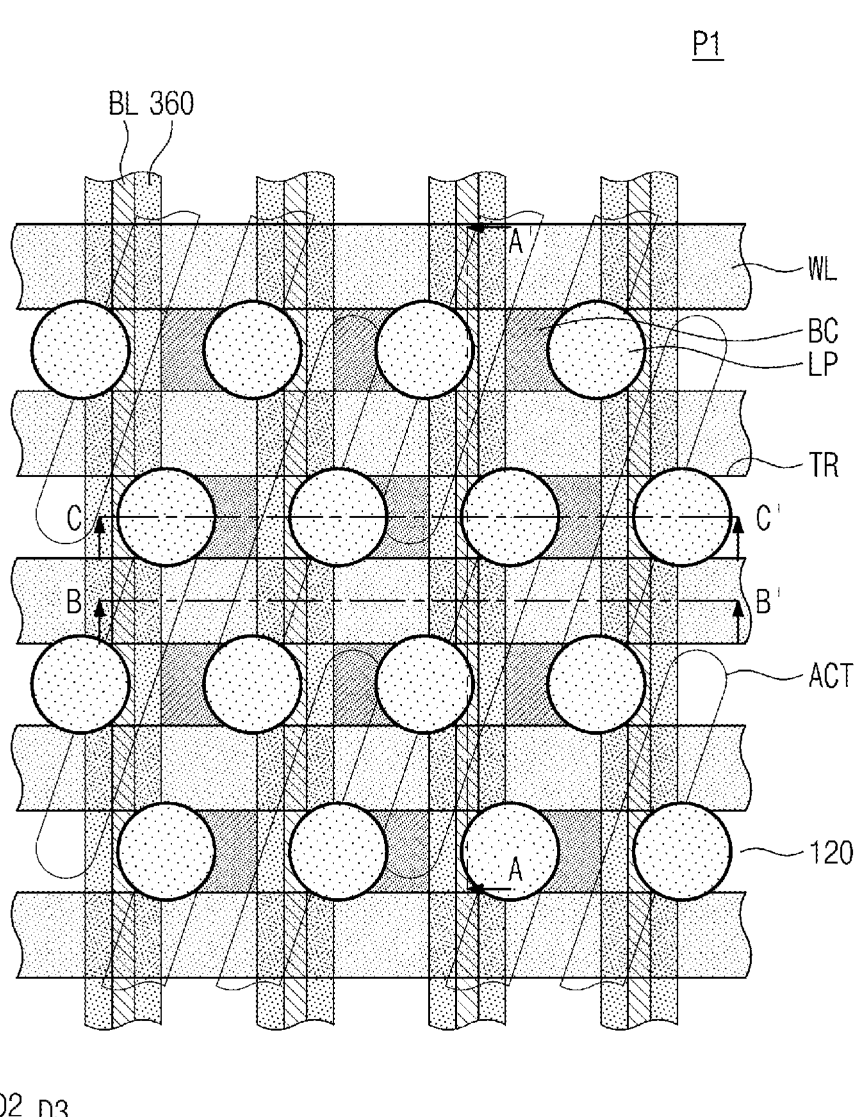
FIG. 2 is a plan view illustrating a portion (e.g., 'P1' of FIG. 1) of a semiconductor memory device according to some embodiments of the inventive concept.
Figure 2:
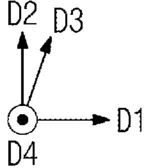
Figure 3A:
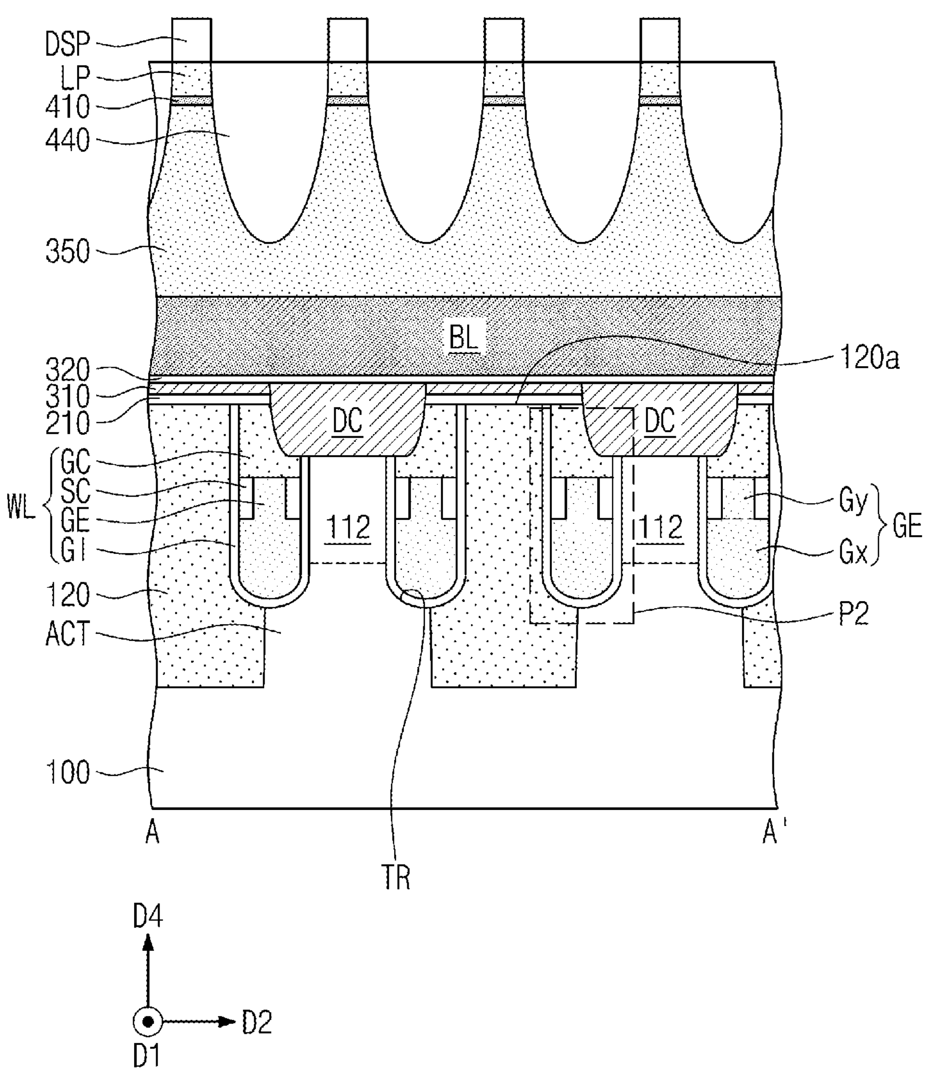
FIGS. 3A to 3C are sectional views, which are respectively taken along lines A-A', B-B', and C-C' of FIG. 2 to illustrate a semiconductor memory device according to some embodiments of the inventive concept.
Figure 3B:
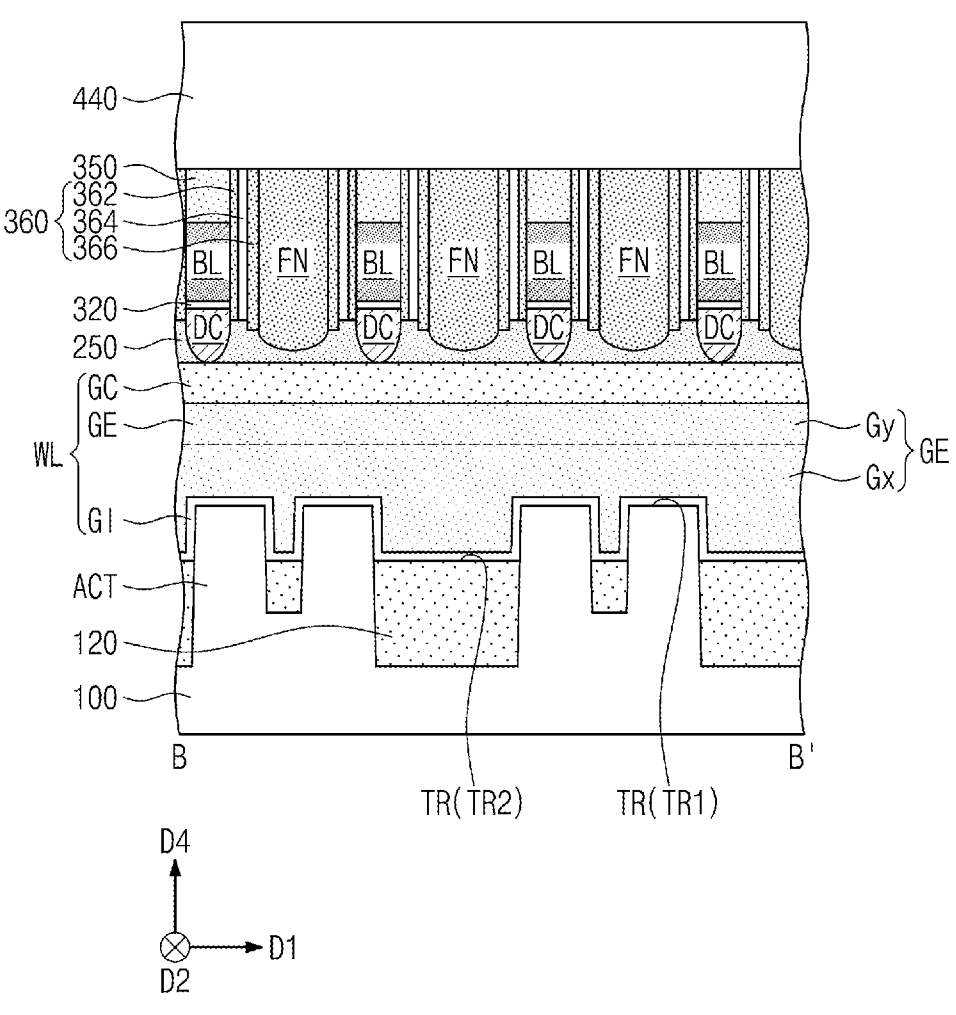
Figure 3C:
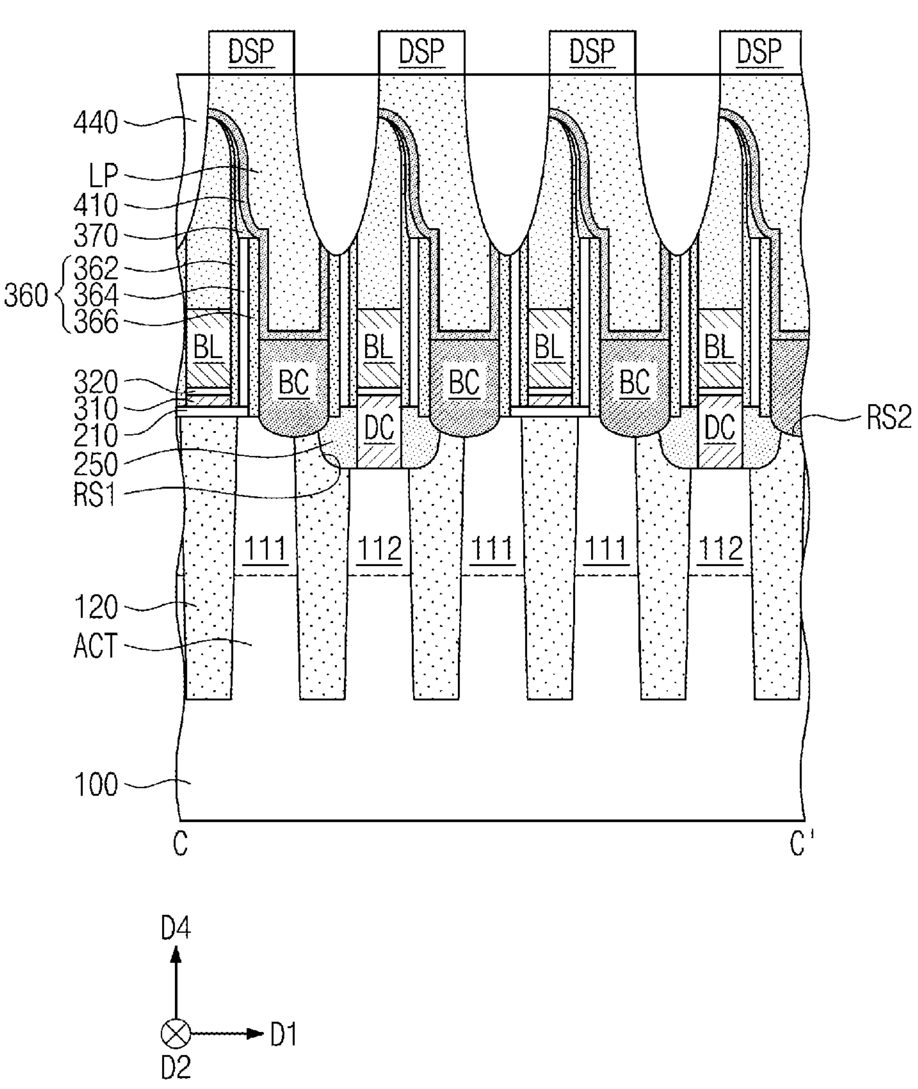
Figure 4:
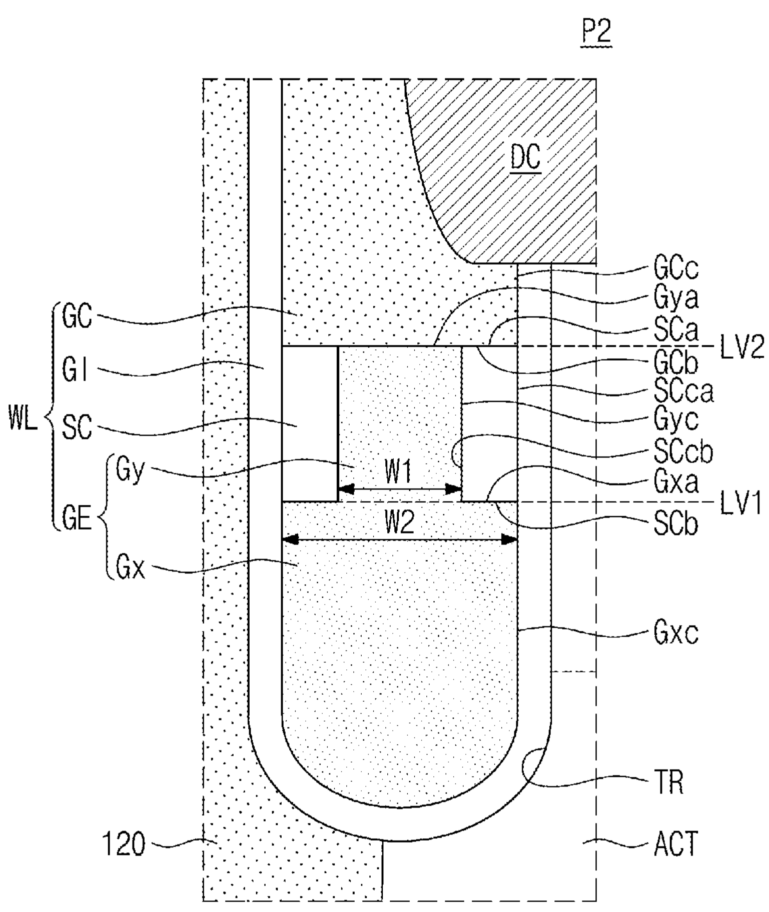
FIG. 4 is an enlarged sectional view illustrating a portion 'P2' of FIG. 3A.

FIG. 2 is a plan view illustrating a portion (e.g., ‘P1’ of FIG. 1) of a semiconductor memory device according to some embodiments of the inventive concept. FIGS. 3A to 3C are sectional views, which are respectively taken along lines A-A', B-B', and C-C' of FIG. 2 to illustrate a semiconductor memory device according to some embodiments of the inventive concept. FIG. 4 is an enlarged sectional view illustrating a portion ‘P2’ of FIG. 3A.

Referring to FIGS. 2 to 4, a substrate 100 may be provided. The substrate 100 may be a semiconductor substrate (e.g., a silicon wafer, a germanium wafer, or a silicon-germanium wafer).

A device isolation pattern 120 may be disposed on the substrate 100 to define active patterns ACT. The active patterns ACT may be provided on the cell blocks CB of FIG. 1. The active patterns ACT may be spaced apart from each other in a first direction D1 and a second direction D2, which are intersecting (e.g., perpendicular) to each other. For example, the first direction D1 may be perpendicular to the second direction D2 and may intersect the second direction D2. The first direction D1 and the second direction D2 may be parallel to a bottom surface of the substrate 100. The active patterns ACT may be bar-shaped patterns, which are spaced apart from each other, resembling islands, and are elongated in a third direction D3. The third direction D3 may be parallel to the bottom surface of the substrate 100 and may intersect the first and second directions D1 and D2. The third direction D3 may not be perpendicular to the first and second directions D1 and D2.

The active patterns ACT may be protruded or extend in a fourth direction D4 perpendicular to the bottom surface of the substrate 100. In some embodiments, the device isolation pattern 120 may be disposed in the substrate 100, and the active patterns ACT may be portions of the substrate 100 surrounded by the device isolation pattern 120. For example, the active patterns ACT may be at least partially surrounded by the device isolation pattern 120. For the sake of convenience in explanation, the term “substrate 100” may refer to the other portion of the substrate 100, excluding the active patterns ACT, unless otherwise stated.

The device isolation pattern 120 may be formed of or include at least one of insulating materials (e.g., silicon oxide, silicon nitride, or combinations thereof). The device isolation pattern 120 may be a single layer, which is made of a single material, or a composite layer including two or more materials. As used herein, each of the expressions of “A or B”, “at least one of A and B”, “at least one of A or B”, “A, B, or C”, “at least one of A, B, and C”, and “at least one of A, B, or C” may be used to represent one of the elements enumerated in the expression or any possible combination of the enumerated elements.

Each of the active patterns ACT may include a pair of edge portions 111 and a center portion 112. The pair of edge portions 111 may be opposite end portions (e.g., opposing end portions) of the active pattern ACT in the third direction D3. The center portion 112 may be a portion of the active pattern ACT, which is interposed between the pair of edge portions 111, specifically, between a pair of word lines WL that will be described below. The pair of edge portions 111 and/or the center portion 112 may be doped with impurities to have an n- or p-type conductivity.

A word line WL may be disposed to cross the active patterns ACT. As an example, the word line WL may cross the active patterns ACT and the device isolation pattern 120 in the first direction D1. In some embodiments, a plurality of word lines WL may be provided. The word lines WL may be spaced apart from each other in the second direction D2. In some embodiments, a pair of the word lines WL, which are adjacent to each other in the second direction D2, may be provided to cross the active patterns ACT thereunder.

The word line WL may be disposed in a trench region TR, which is formed to cross the active patterns ACT and the device isolation pattern 120. The trench region TR may extend in the first direction D1. The trench region TR may include a first trench region TR1 and a second trench region TR2. A bottom surface of the first trench region TR1 may be disposed at a level higher than a bottom surface of the second trench region TR2. Here, the term “level” may be defined as a height measured from the bottom surface of the substrate 100. For example, the height may be measured in the fourth direction D4 from the bottom surface of the substrate 100, and the bottom surface of the substrate 100 may serve as a base reference layer. The first trench region TR1 may be disposed on the active patterns ACT, and the second trench region TR2 may be disposed on the device isolation pattern 120.

Each of the word lines WL may include a gate electrode GE, a gate insulating pattern GI, a gate capping pattern GC, and a side-capping pattern SC. The gate electrode GE may be disposed to cross the active pattern ACT and the device isolation pattern 120 in the first direction D1. The gate insulating pattern GI may be interposed between the gate electrode GE and the active patterns ACT and between the gate electrode GE and the device isolation pattern 120. The gate capping pattern GC may be disposed on the gate electrode GE to cover a top surface of the gate electrode GE. The side-capping pattern SC may be interposed between the gate electrode GE and the gate insulating pattern GI. Hereinafter, the gate electrode GE, the gate insulating pattern GI, the side-capping pattern SC, and the gate capping pattern GC will be described in more detail below.

The gate electrode GE may include a lower portion Gx and an upper portion Gy, which are connected to each other at a first level LV1. The first level LV1 may be defined as a height, at which a width of the gate electrode GE in the second direction D2 is discontinuously changed when a height in the fourth direction D4 is changed. The lower portion Gx of the gate electrode GE may be a portion of the gate electrode GE placed under the first level LV1. The upper portion Gy of the gate electrode GE may be the other portion of the gate electrode GE placed on the first level LV1.

The lower and upper portions Gx and Gy of the gate electrode GE may be in contact with each other at the first level LV1. The upper portion Gy of the gate electrode GE may have a first width W1, which is a width in the second direction D2, at the first level LV1. The lower portion Gx of the gate electrode GE may have a second width W2, which is a width in the second direction D2, at the first level LV1. The second width W2 may be larger than the first width W1. To simplify the illustration, the first and second widths W1 and W2 of FIG. 4 are shown at two different heights near the first level LV1, but it should be understood that the first and second widths W1 and W2 are actually defined at the first level LV1.

The lower portion Gx of the gate electrode GE may include a top surface, which is located at the first level LV1 and is in contact with the upper portion Gy of the gate electrode GE. The upper portion Gy of the gate electrode GE may cover or be on a portion of the top surface of the lower portion Gx of the gate electrode GE. The upper portion Gy of the gate electrode GE may not cover or be on other portions of the top surface of the lower portion Gx of the gate electrode GE.

As an example, the gate electrode GE may be formed of or include at least one of metallic materials (e.g., Ti, Mo, W, Cu, Al, Ta, Ru, and Ir), the metal nitride materials (e.g., nitrides of Ti, Mo, W, Cu, Al, Ta, Ru, and Ir), or combinations thereof. In some embodiments, the gate electrode GE may be formed of a single material. In some other embodiments, the gate electrode GE may include two or more materials.

The gate insulating pattern GI may conformally cover an inner surface of the trench region TR. The gate insulating pattern GI may be interposed between the lower portion Gx of the gate electrode GE and the active pattern ACT and between the lower portion Gx of the gate electrode GE and the device isolation pattern 120. The gate insulating pattern GI may be in contact with the lower portion Gx of the gate electrode GE. As an example, the gate insulating pattern GI may be in contact with a side surface Gxc of the lower portion Gx of the gate electrode GE. The gate insulating pattern GI may be interposed between the upper portion Gy of the gate electrode GE and the active pattern ACT and between the upper portion Gy of the gate electrode GE and the device isolation pattern 120. The gate insulating pattern GI may be spaced apart from the upper portion Gy of the gate electrode GE. As an example, the gate insulating pattern GI may be spaced apart from a side surface Gyc of the upper portion Gy of the gate electrode GE. In some embodiments, the gate insulating pattern GI may further extend into spaces between the gate capping pattern GC and the active pattern ACT and between the gate capping pattern GC and the device isolation pattern 120. The gate insulating pattern GI may be formed of or include at least one of silicon oxide, high-k dielectric materials, or combinations thereof.

The gate capping pattern GC may fill an upper portion of the trench region TR. The gate capping pattern GC may be disposed on a top surface Gya of the upper portion Gy of the gate electrode GE. The gate capping pattern GC may be in contact with the top surface Gya of the upper portion Gy of the gate electrode GE. The upper portion Gy of the gate electrode GE may cover or be on a portion of a bottom surface GCb of the gate capping pattern GC. The upper portion Gy of the gate electrode GE may not cover or be on the other portions of the bottom surface GCb of the gate capping pattern GC. The gate capping pattern GC may be spaced apart from the lower portion Gx of the gate electrode GE. As an example, the gate capping pattern GC may be spaced apart from a top surface Gxa of the lower portion Gx of the gate electrode GE. The gate capping pattern GC may be formed of or include silicon nitride.

The side-capping pattern SC may cover or be on the side surface Gyc of the upper portion Gy of the gate electrode GE. As an example, a pair of side-capping patterns SC may cover or be on opposite side surfaces Gyc (e.g., opposing side surfaces Gyc) of the upper portion Gy of the gate electrode GE. The side-capping pattern SC may be interposed between the side surface Gyc of the upper portion Gy of the gate electrode GE and the gate insulating pattern GI. An outer side surface SCca of the side-capping pattern SC may be in contact with the gate insulating pattern GI. An inner side surface SCcb of the side-capping pattern SC may be in contact with the upper portion Gy of the gate electrode GE.

The side-capping pattern SC may be disposed on the top surface Gxa of the lower portion Gx of the gate electrode GE. In some embodiments, a bottom surface SCb of the side-capping pattern SC may cover or be on a portion of the top surface Gxa of the lower portion Gx of the gate electrode GE, which is not covered with the upper portion Gy of the gate electrode GE. The side-capping pattern SC may not cover or be on the side surface Gxc of the lower portion Gx of the gate electrode GE. For example, the side surface Gxc of the lower portion Gx of the gate electrode GE may be free of the side-capping pattern SC thereon. The bottom surface SCb of the side-capping pattern SC may be located at the first level LV1.

The side-capping pattern SC may be interposed between the lower portion Gx of the gate electrode GE and the gate capping pattern GC. As an example, the side-capping pattern SC may extend from the gate capping pattern GC toward the lower portion Gx of the gate electrode GE along the side surface Gyc of the upper portion Gy of the gate electrode GE. In some embodiments, a top surface SCa of the side-capping pattern SC may cover or be on a portion of the bottom surface GCb of the gate capping pattern GC, which is not covered with the upper portion Gy of the gate electrode GE. The side-capping pattern SC may not be interposed between the side surface Gxc of the lower portion Gx of the gate electrode GE and the gate insulating pattern GI. For example, the side-capping pattern SC may not extend between the lower portion Gx of the gate electrode GE and the gate insulating pattern GI.

The outer side surface SCca of the side-capping pattern SC may be aligned with the side surface Gxc of the lower portion Gx of the gate electrode GE in the second direction D2. As an example, the outer side surface SCca of the side-capping pattern SC may be coplanar with the side surface Gxc of the lower portion Gx of the gate electrode GE. The outer side surface SCca of the side-capping pattern SC may be aligned with a side surface GCc of the gate capping pattern GC in the second direction D2. As an example, the outer side surface SCca of the side-capping pattern SC may be coplanar with the side surface GCc of the gate capping pattern GC.

A level of the top surface SCa of the side-capping pattern SC may be defined as a second level LV2. The top surface Gya of the upper portion Gy of the gate electrode GE may be located at a level that is equal to or lower than the second level LV2. That is, the top surface SCa of the side-capping pattern SC may be located at a level that is equal to or higher than the top surface Gya of the upper portion Gy of the gate electrode GE. As an example, the top surface SCa of the side-capping pattern SC may be coplanar with the top surface Gya of the upper portion Gy of the gate electrode GE, at the second level LV2. The top surface SCa of the side-capping pattern SC may be located at a level lower than the uppermost surface 120*a* (see FIG. 3A) of the device isolation pattern 120. For example, the top surface SCa of the side-capping pattern SC may be located at a level lower than the uppermost surface 120*a* of the device isolation pattern 120, relative to the bottom surface of the substrate 100 where the bottom surface of the substrate 100 is a base reference layer.

The side-capping pattern SC may include a material different from the gate electrode GE. For example, the side-capping pattern SC may include a material having a work function greater than the gate electrode GE. As an example, the side-capping pattern SC may include a material having a work function of 4.4 eV or greater, and the gate electrode GE may include a material having a work function of 4.2 eV. For example, the side-capping pattern SC may include a material having an electric resistivity higher than the gate electrode GE. As an example, the side-capping pattern SC may be formed of or include doped polysilicon.

Since the side-capping pattern SC having a work function greater than the gate electrode GE is interposed between the gate electrode GE and the gate insulating pattern GI, a leakage current in the gate electrode GE and the active pattern ACT may be reduced. However, in the case where the side-capping pattern SC, which has higher electric resistivity than the gate electrode GE, is provided over a wide region, it may lead to deterioration in the electrical characteristics of the semiconductor device.

According to some embodiments of the inventive concept, the side-capping pattern SC may be locally provided on a side surface of the gate electrode GE (i.e., on the side surface Gyc of the upper portion Gy of the gate electrode GE), and the gate electrode GE may be provided over a wider region. This may make it possible to improve both the electrical and reliability characteristics of a semiconductor memory device.

A buffer pattern 210 may be disposed on the substrate 100. The buffer pattern 210 may cover or be on the active patterns ACT, the device isolation pattern 120, and the word lines WL. In some embodiments, the buffer pattern 210 may be formed of or include at least one of silicon oxide, silicon nitride, silicon oxynitride, or combinations thereof. The buffer pattern 210 may be a single layer, which is made of a single material, or a composite layer including two or more materials.

A bit line contact DC may be provided on each of the active patterns ACT, and in some embodiments, a plurality of bit line contacts DC may be provided. The bit line contacts DC may be connected to the center portions 112 of the active patterns ACT, respectively. In the present specification, the expression "A is connected to B" may be used to not only represent "A is in contact with B" but also to represent that "A is electrically connected to B" although they are not in physical contact with each other. The bit line contacts DC may be spaced apart from each other in the first and second directions D1 and D2. The bit line contact DC may be interposed between each of the active patterns ACT and a corresponding one of bit lines BL, which will be described below. Each of the bit line contacts DC may connect a corresponding one of the bit lines BL to the center portion 112 of a corresponding one of the active patterns ACT.

The bit line contacts DC may be disposed in first recess regions RS1, respectively (see FIG. 3C). The first recess regions RS1 may be provided in upper portions of the active patterns ACT and an upper portion of the device isolation pattern 120, which is adjacent to the upper portions of the active patterns ACT. The first recess regions RS1 may be spaced apart from each other in the first and second directions D1 and D2.

A gapfill insulating pattern 250 may fill each of the first recess regions RS1. The gapfill insulating pattern 250 may fill an inner space of the first recess region RS1. As an example, the gapfill insulating pattern 250 may cover or be on an inner surface of the first recess region RS1 and at least a portion of a side surface of the bit line contact DC (e.g., in the first recess region RS1). The gapfill insulating pattern 250 may be formed of or include at least one of silicon oxide, silicon nitride, or combinations thereof. The gapfill insulating pattern 250 may be a single layer, which is made of a single material, or a composite layer including two or more materials.

The bit line BL may be provided on the bit line contact DC. The bit line BL may extend in the second direction D2. The bit line BL may be disposed on the bit line contacts DC, which are arranged in the second direction D2 to form a line. In some embodiments, a plurality of bit lines BL may be provided. The bit lines BL may be spaced apart from each other in the first direction D1. The bit line BL may be formed of or include at least one of metallic materials. As an example, the bit line BL may be formed of or include at least one of tungsten, rubidium, molybdenum, titanium, or combinations thereof.

A polysilicon pattern 310 may be provided between the bit line BL and the buffer pattern 210 and between the bit line contacts DC, which are adjacent to each other in the second direction D2. In some embodiments, a plurality of polysilicon patterns 310 may be provided. The polysilicon patterns 310 may be spaced apart from each other in the first direction D1 and the second direction D2. A top surface of the polysilicon pattern 310 may be located at substantially the same height as a top surface of the bit line contact DC and may be coplanar with the top surface of the bit line contact DC. The polysilicon pattern 310 may be formed of or include doped polysilicon.

A first barrier pattern 320 may be provided between the bit line BL and the bit line contact DC and between the bit line BL and the polysilicon pattern 310. The first barrier pattern 320 may extend along the bit lines BL or in the second direction D2. In some embodiments, a plurality of first barrier patterns 320 may be provided to be spaced apart from each other. The first barrier patterns 320 may be spaced apart from each other in the first direction D1. The first barrier pattern 320 may be formed of or include at least one of conductive metal nitride materials (e.g., titanium nitride and tantalum nitride). A first ohmic pattern (not shown) may be additionally interposed between the bit line BL and the bit line contact DC and between the bit line BL and the polysilicon pattern 310. The first ohmic pattern may be formed of or include at least one of metal silicide materials.

A bit line capping pattern 350 may be provided on a top surface of the bit line BL. On the top surface of the bit line BL, the bit line capping pattern 350 may extend in the second direction D2. In some embodiments, a plurality of bit line capping patterns 350 may be provided. The bit line capping patterns 350 may be spaced apart from each other in the first direction D1. The bit line capping pattern 350 may vertically overlap with the bit line BL. As used herein, "an element A vertically overlapping with an element B" (or similar language) means that there is at least one line that extends in the fourth direction D4 and intersects both the elements A and B. The bit line capping pattern 350 may be composed of a single layer or a plurality of layers. As an example, the bit line capping pattern 350 may include a first capping pattern, a second capping pattern, and a third capping pattern, which are sequentially stacked. The first to third capping patterns may be formed of or include silicon nitride. As another example, the bit line capping pattern 350 may include a plurality of capping patterns, which are stacked to form four or more layers.

A bit line spacer 360 may be provided on a side surface of the bit line BL and a side surface of the bit line capping pattern 350. The bit line spacer 360 may cover the side surface of the bit line BL and the side surface of the bit line capping pattern 350. The bit line spacer 360 on the side surface of the bit line BL may extend in the second direction D2. In some embodiments, a plurality of bit line spacers 360 may be provided. The bit line spacers 360 may be spaced apart from each other in the first direction D1.

Each of the bit line spacers 360 may include a plurality of spacers. As an example, each of the bit line spacers 360 may include a first spacer 362, a second spacer 364, and a third spacer 366. The first spacer 362 may be provided on the side surface of the bit line BL and the side surface of the bit line capping pattern 350. The first spacer 362 may be interposed between the bit line BL and the third spacer 366 and between the bit line capping pattern 350 and the third spacer 366. The second spacer 364 may be interposed between the first spacer 362 and the third spacer 366. In some embodiments, each of the first to third spacers 362, 364, and 366 may be independently formed of or include at least one of silicon nitride, silicon oxide, silicon oxynitride, or combinations thereof. As another example, the second spacer 364 may include an air gap separating the first and third spacers 362 and 366 from each other.

A capping spacer 370 (see FIG. 3C) may be placed on the bit line spacer 360. The capping spacer 370 may cover an upper portion of a side surface of the bit line spacer 360. In some embodiments, the capping spacer 370 may be formed of or include silicon nitride.

A storage node contact BC may be provided between adjacent ones of the bit lines BL. As an example, the storage node contact BC may be interposed between adjacent ones of the bit line spacers 360. In some embodiments, a plurality of storage node contacts BC may be provided. The storage node contacts BC may be spaced apart from each other in the first and second directions D1 and D2. The storage node contacts BC may be spaced apart from each other in the second direction D2 by fence patterns FN on the word lines WL. The fence pattern FN may be provided between adjacent ones of the bit lines BL. In some embodiments, a plurality of fence patterns FN may be provided. The fence patterns FN may be spaced apart from each other in the first and second directions D1 and D2. The fence patterns FN, which are adjacent to each other in the first direction D1, may be spaced apart from each other, with the bit line BL interposed therebetween. The fence patterns FN, which are adjacent to each other in the second direction D2, may be spaced apart from each other, with the storage node contact BC interposed therebetween. In some embodiments, the fence patterns FN may be formed of or include silicon nitride.

The storage node contact BC may fill a second recess region RS2 (see FIG. 3C), which is provided on the edge portion 111 of the active pattern ACT. The storage node contact BC may be connected to the edge portion 111. The storage node contact BC may be formed of or include at least one of doped or undoped polysilicon, metallic materials, or combinations thereof.

A second barrier pattern 410 may conformally cover or be on the bit line spacer 360, the fence pattern FN, and the storage node contact BC. The second barrier pattern 410 may be formed of or include at least one of metal nitride materials (e.g., titanium nitride and tantalum nitride). A second ohmic pattern (not shown) may be further interposed between the second barrier pattern 410 and the storage node contact BC. The second ohmic pattern may be formed of or include at least one of metal silicide materials.

A landing pad LP may be provided on the storage node contact BC. In some embodiments, a plurality of landing pads LP may be provided. The landing pads LP may be spaced apart from each other in the first and second directions D1 and D2. Each of the landing pads LP may be connected to a corresponding one of the storage node contacts BC. The landing pad LP may cover or be on a top surface of the bit line capping pattern 350. A lower region of the landing pad LP may vertically overlap with the storage node contact BC. An upper region of the landing pad LP may be shifted or offset from the lower region in the first direction D1. The landing pad LP may be formed of or include at least one of metallic materials (e.g., tungsten, titanium, and tantalum).

A filler pattern 440 may be provided to enclose the landing pad LP. The filler pattern 440 may be interposed between adjacent ones of the landing pads LP. When viewed in a plan view, the filler pattern 440 may be provided in a mesh shape with holes, and in this case, the landing pads LP may be provided in the holes to penetrate the filler pattern 440. As an example, the filler pattern 440 may be formed of or include at least one of silicon nitride, silicon oxide, silicon oxynitride, or combinations thereof. As another example, the filler pattern 440 may include an empty space with an air layer (i.e., an air gap).

A data storage pattern DSP may be provided on the landing pad LP. In some embodiments, a plurality of data storage patterns DSP may be provided. The data storage patterns DSP may be spaced apart from each other in the first and second directions D1 and D2. Each of the data storage patterns DSP may be connected to a corresponding one of the edge portions 111 through a corresponding one of the landing pads LP and a corresponding one of the storage node contacts BC.

As an example, the data storage pattern DSP may be a capacitor including a bottom electrode, a dielectric layer, and a top electrode. In this case, the semiconductor memory device may be a dynamic random access memory (DRAM) device. As another example, the data storage pattern DSP may include a magnetic tunnel junction pattern. In this case, the semiconductor memory device may be a magnetic random access memory (MRAM) device. As other examples, the data storage pattern DSP may include a phase-change material or a variable resistance material. In this case, the semiconductor memory device may be a phase-change random access memory (PRAM) device or a resistive random access memory (ReRAM) device. However, the inventive concept is not limited to these examples, and the data storage pattern DSP may include various structures and/or materials that can be used to store data therein.

Figure 5A:
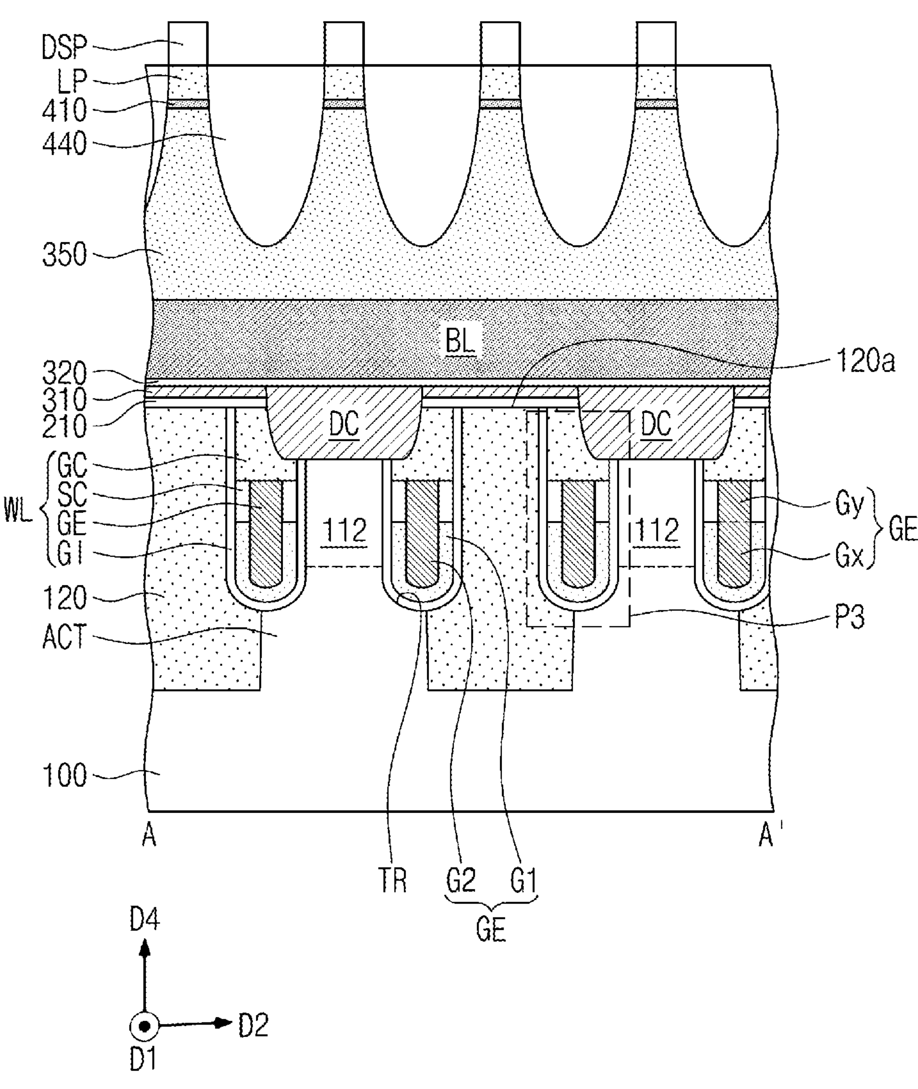
FIGS. 5A and 5B are sectional views, which are respectively taken along the lines A-A' and B-B' of FIG. 2 to illustrate a semiconductor memory device according to some embodiments of the inventive concept.
Figure 5B:
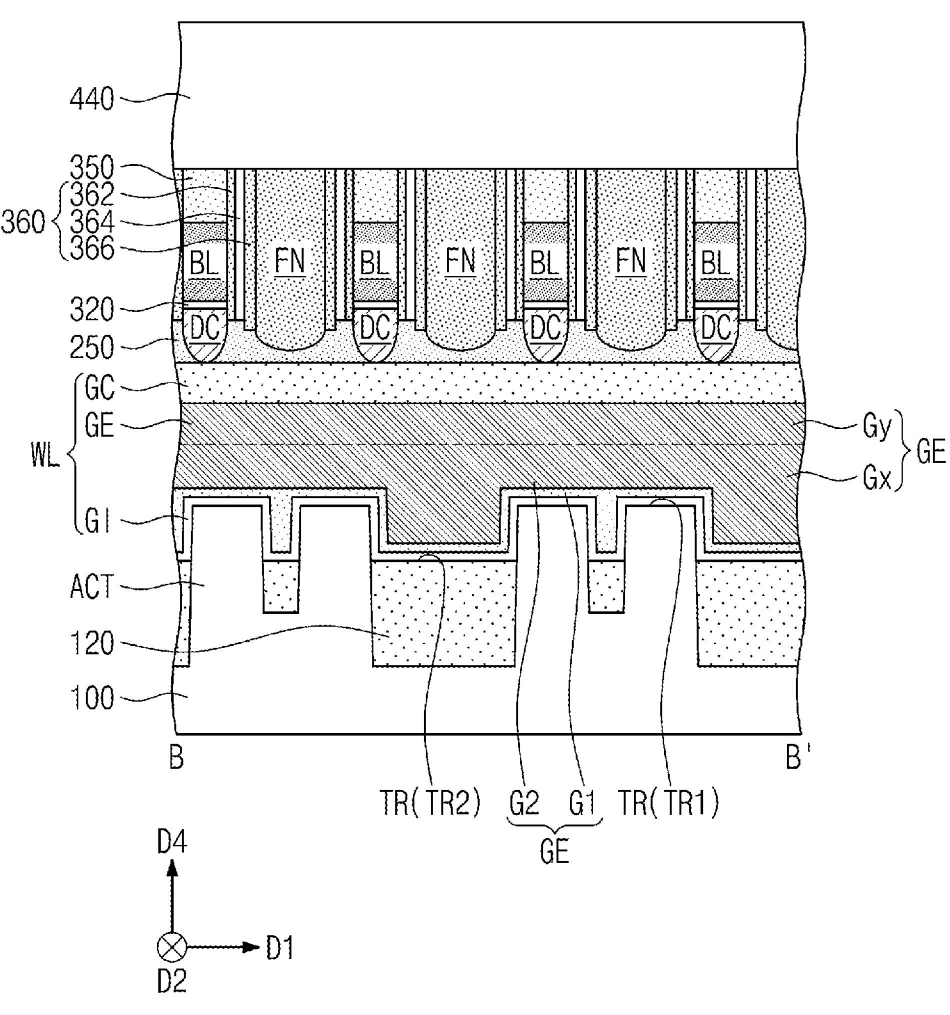
Figure 6:
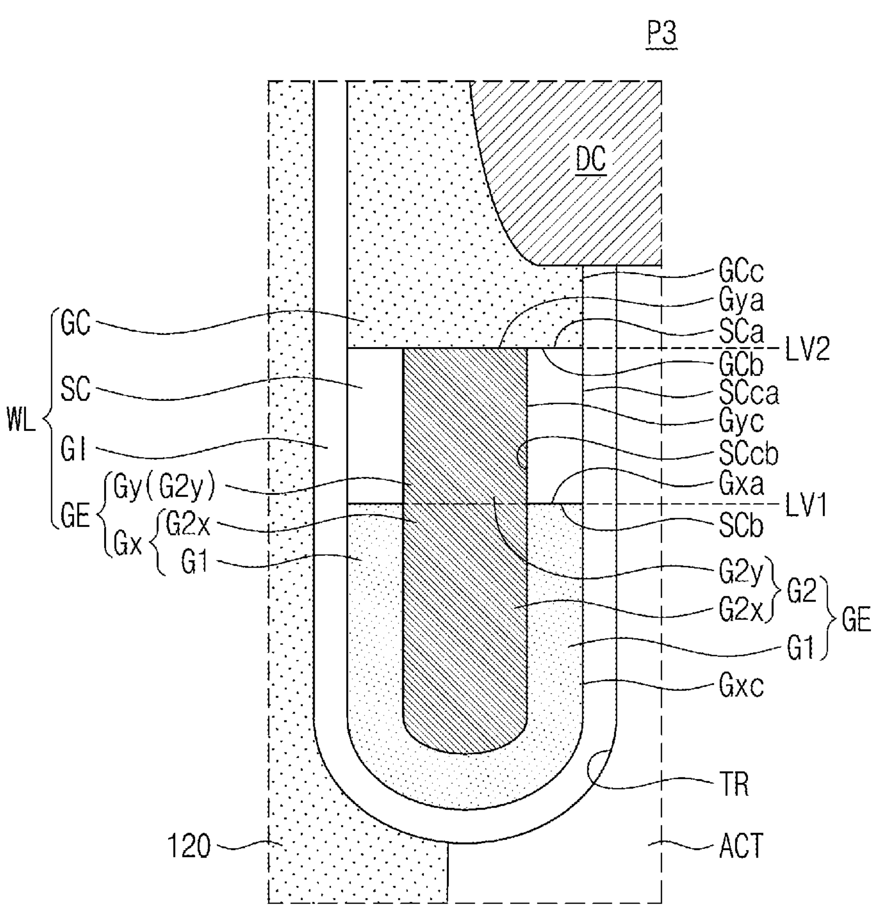
FIG. 6 is an enlarged sectional view illustrating a portion 'P3' of FIG. 5A.

FIGS. 5A and 5B are sectional views, which are respectively taken along the lines A-A' and B-B' of FIG. 2 to illustrate a semiconductor memory device according to some embodiments of the inventive concept. FIG. 6 is an enlarged sectional view illustrating a portion 'P3' of FIG. 5A. Hereinafter, a semiconductor memory device according to some embodiments of the inventive concept will be described with reference to FIGS. 5A to 6. For concise description, a previously-described element may be identified by the same reference number without repeating an overlapping description thereof.

Referring to FIGS. 5A to 6, the gate electrode GE may include a first electrode G1 and a second electrode G2, which are formed of or include different materials from each other. The first electrode G1 may be interposed between the second electrode G2 and the active pattern ACT and between the second electrode G2 and the device isolation pattern 120. The second electrode G2 may include a lower portion G2*x* and an upper portion G2*y*, which are connected to each other at the first level LV1. The lower portion G2*x* of the second electrode G2 may be a portion of the second electrode G2 placed under the first level LV1. The upper portion G2*y* of the second electrode G2 may be the other portion of the second electrode G2 placed on the first level LV1. When measured in the second direction D2 at the first level LV1, a width of the upper portion G2*y* of the second electrode G2 may be substantially equal to a width of the lower portion G2*x* of the second electrode G2.

In some embodiments, the first electrode G1 may include a material whose electric resistivity is higher than that of the second electrode G2. As an example, the first electrode G1 may be formed of or include a metal nitride material (e.g., nitride materials containing Ti, Mo, W, Cu, Al, Ta, Ru, or Ir), and the second electrode G2 may be formed of or include a metallic material (e.g., Ti, Mo, W, Cu, Al, Ta, Ru, or Ir) having an electric resistivity lower than the first electrode G1.

The lower portion Gx of the gate electrode GE may include the first electrode G1 and the lower portion G2*x* of the second electrode G2. In some embodiments, the first electrode G1 may surround the lower portion G2*x* of the second electrode G2. For example, the first electrode G1 may at least partially surround the lower portion G2*x* of the second electrode G2. A top surface of the first electrode G1 may be located at the first level LV1. The top surface of the first electrode G1 may not be covered with the upper portion G2*y* of the second electrode G2.

The upper portion Gy of the gate electrode GE may include the upper portion G2*y* of the second electrode G2. The upper portion G2*y* of the second electrode G2 may not be surrounded by the first electrode G1. For example, the first electrode G1 may not be on opposing side surfaces of the upper portion G2*y* of the second electrode G2. The top surface Gya of the upper portion Gy of the gate electrode GE (e.g., the top surface of the upper portion G2*y* of the second electrode G2) may be located at the second level LV2. The top surface of the upper portion G2*y* of the second electrode G2 may extend in the second direction D2, at the second level LV2. In some embodiments, the top surface of the upper portion G2*y* of the second electrode G2 at the second level LV2 may be coplanar with the top surface SCa of the side-capping pattern SC. The bottom surface GCb of the gate capping pattern GC may be in contact with the top surface of the upper portion G2*y* of the second electrode G2.

The side-capping pattern SC may be provided to surround the upper portion G2*y* of the second electrode G2. For example, the side-capping pattern SC may at least partially surround the upper portion G2*y* of the second electrode G2. The side-capping pattern SC may be interposed between the upper portion G2*y* of the second electrode G2 and the gate insulating pattern GI. A top surface SCa of the side-capping pattern SC may be located at a level that is substantially equal to or higher than the top surface of the upper portion G2*y* of the second electrode G2. The side-capping pattern SC may cover or be on the top surface of the first electrode G1. The side-capping pattern SC may be interposed between the top surface of the first electrode G1 and the bottom surface GCb of the gate capping pattern GC. The side-capping pattern SC may not be interposed between the first electrode G1 and the gate insulating pattern GI.

According to some embodiments of the inventive concept, the second electrode G2 having a relatively low resistivity may be used as the lower and upper portions Gx and Gy of the gate electrode GE. Accordingly, an electric resistance of the gate electrode GE may be reduced. As a result, the electrical characteristics of the semiconductor memory device may be improved.

Figure 7A:
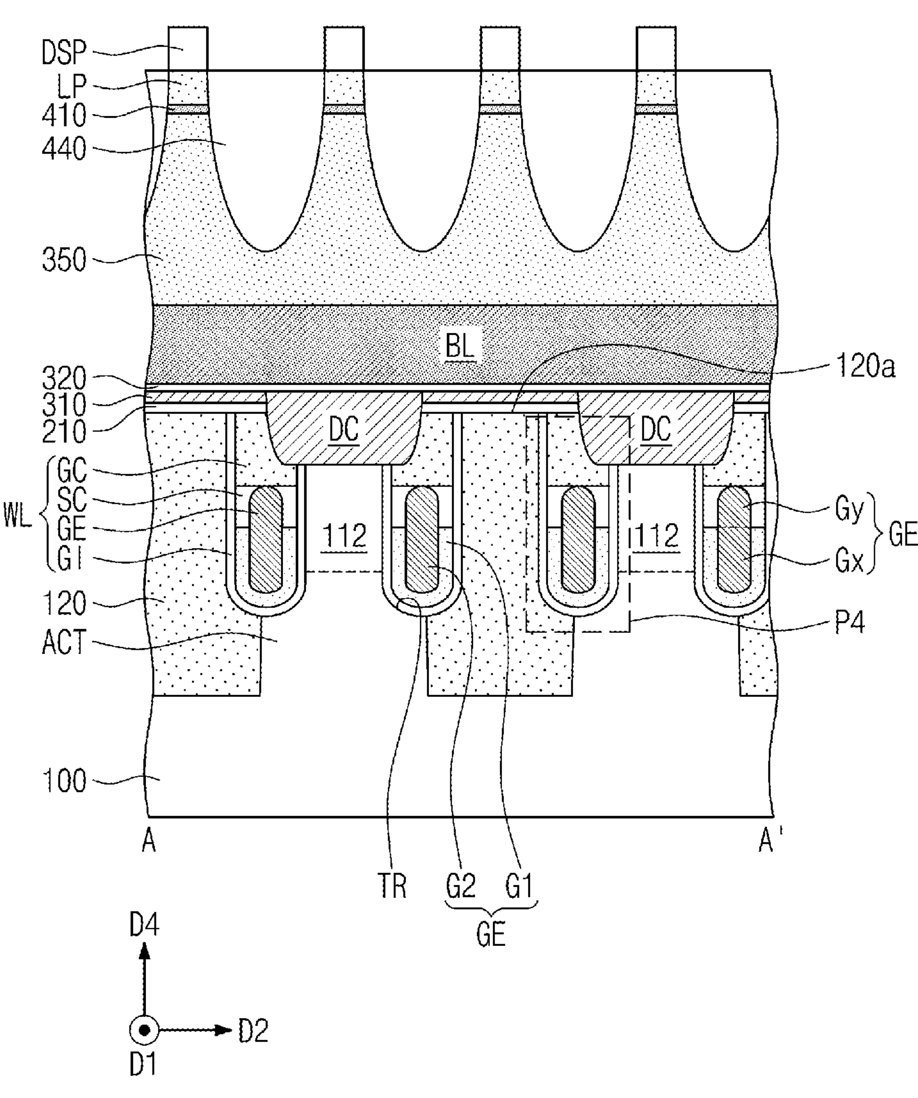
FIGS. 7A and 7B are sectional views, which are respectively taken along the lines A-A' and B-B' of FIG. 2 to illustrate a semiconductor memory device according to some embodiments of the inventive concept.
Figure 7B:
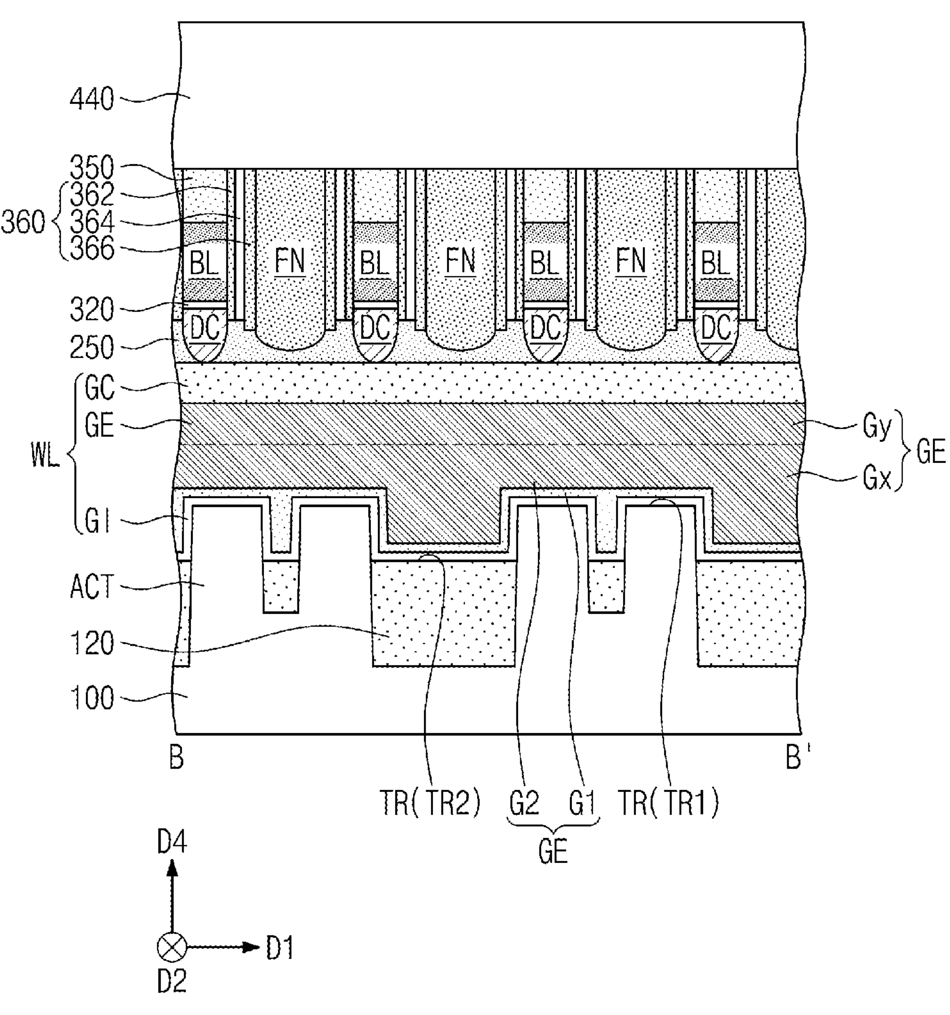
Figure 8:
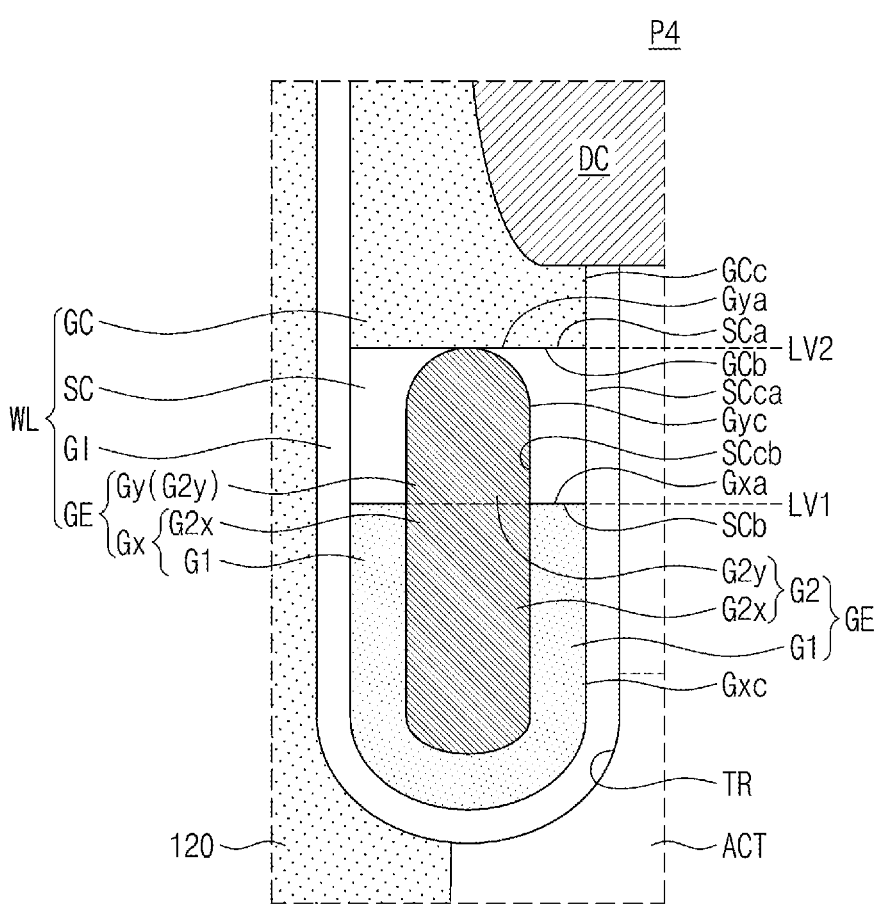
FIG. 8 is an enlarged sectional view illustrating a portion 'P4' of FIG. 7A.

FIGS. 7A and 7B are sectional views, which are respectively taken along the lines A-A' and B-B' of FIG. 2 to illustrate a semiconductor memory device according to some embodiments of the inventive concept. FIG. 8 is an enlarged sectional view illustrating a portion 'P4' of FIG. 7A. Hereinafter, a semiconductor memory device according to some embodiments of the inventive concept will be described with reference to FIGS. 7A to 8. For concise description, a previously-described element may be identified by the same reference number without repeating an overlapping description thereof.

Referring to FIGS. 7A to 8, an upper end of the upper portion G2*y* of the second electrode G2 may have a rounded shape. The topmost end of the upper portion G2*y* of the second electrode G2 may be located at the same level as the top surface SCa of the side-capping pattern SC. As an example, the topmost end of the upper portion G2*y* of the second electrode G2 may be located at the second level LV2. The gate capping pattern GC may be in contact with the topmost end of the upper portion G2*y* of the second electrode G2.

Figure 9A:
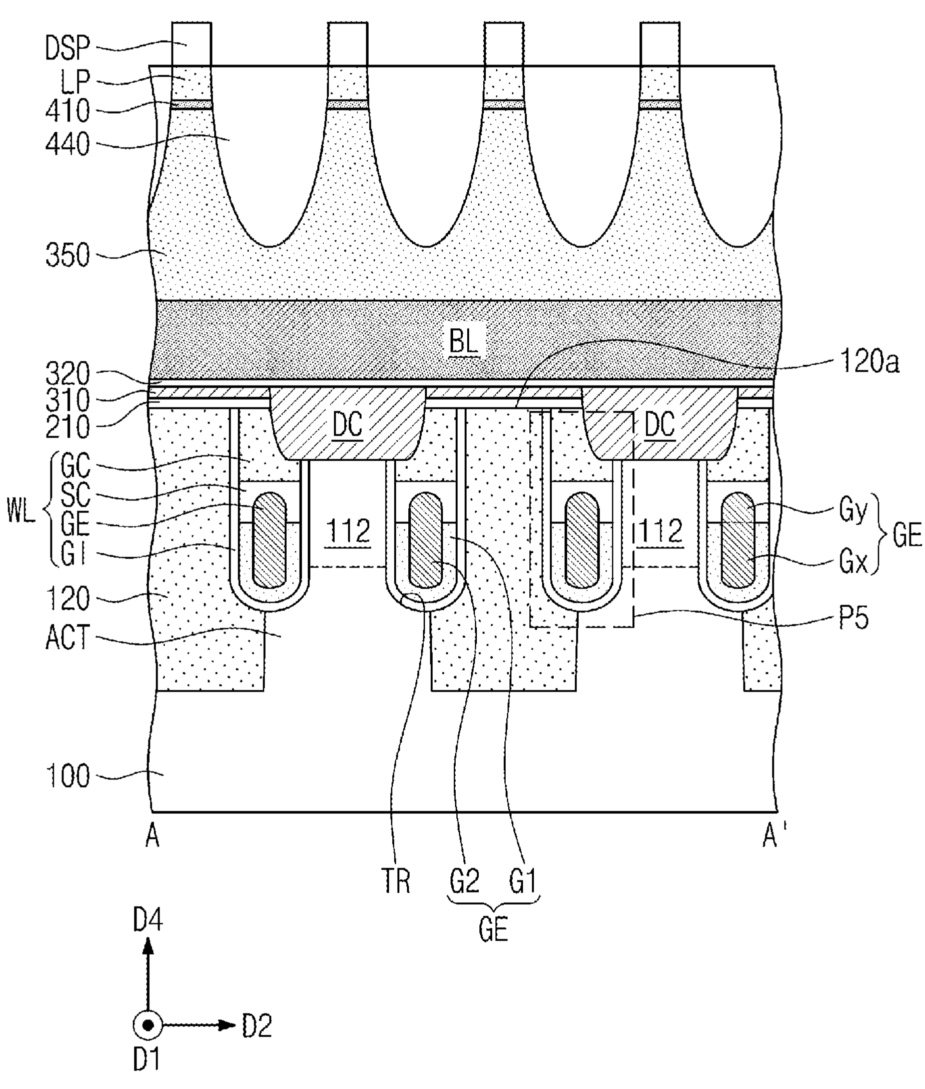
FIGS. 9A and 9B are sectional views, which are respectively taken along the lines A-A' and B-B' of FIG. 2 to illustrate a semiconductor memory device according to some embodiments of the inventive concept.
Figure 9B:
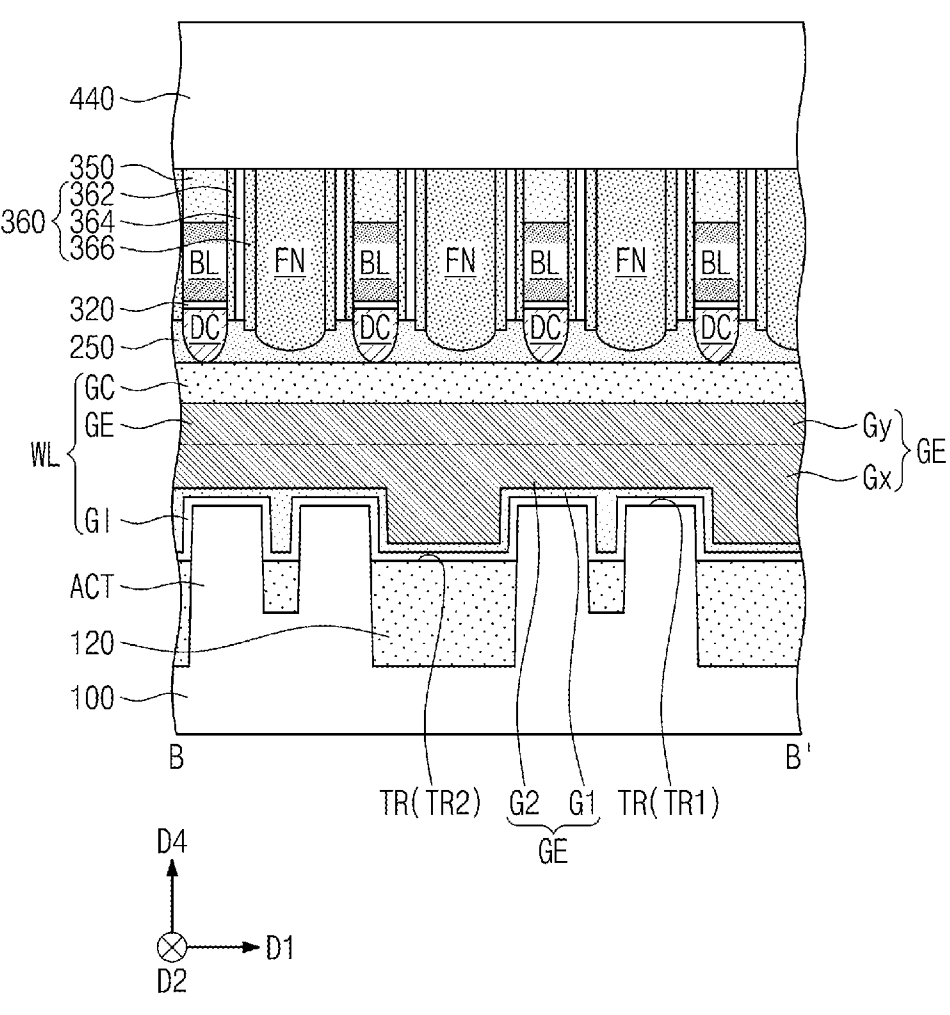
Figure 10:
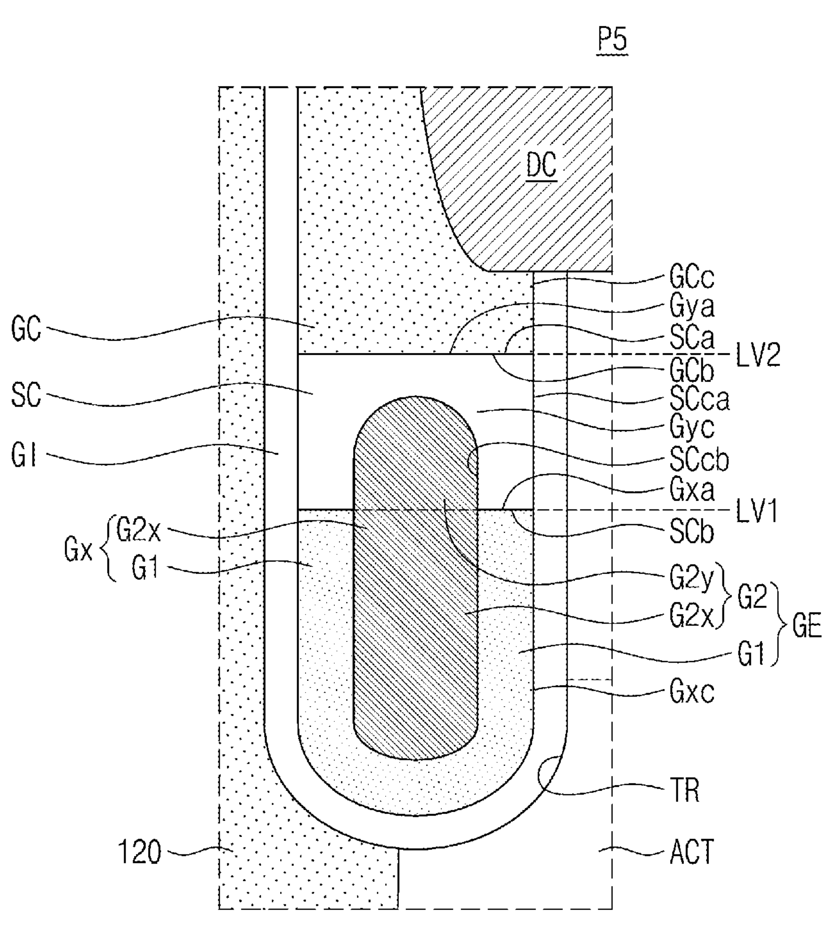
FIG. 10 is an enlarged sectional view illustrating a portion 'P5' of FIG. 9A.

FIGS. 9A and 9B are sectional views, which are respectively taken along the lines A-A' and B-B' of FIG. 2 to illustrate a semiconductor memory device according to some embodiments of the inventive concept. FIG. 10 is an enlarged sectional view illustrating a portion 'P5' of FIG. 9A. Hereinafter, a semiconductor memory device according to some embodiments of the inventive concept will be described with reference to FIGS. 9A to 10. For concise description, a previously-described element may be identified by the same reference number without repeating an overlapping description thereof.

Referring to FIGS. 9A to 10, the topmost end of the upper portion G2*y* of the second electrode G2 may be located at a level lower than the top surface SCa of the side-capping G2 may be located at a level lower than the second level LV2. In some embodiments, an upper end of the upper portion G2*y* of the second electrode G2 may have a rounded shape.

The side-capping pattern SC may cover or be on not only opposite side surfaces (e.g., opposing side surfaces) of the upper portion G2*y* of the second electrode G2 but also the topmost end of the upper portion G2*y* of the second electrode G2. For example, the side-capping pattern SC may be on a top surface of the upper portion G2*y* of the second electrode G2. The side-capping pattern SC may be interposed between the opposite side surfaces of the upper portion G2*y* of the second electrode G2 and the gate insulating pattern GI and between the topmost end of the upper portion G2*y* of the second electrode G2 and the gate capping pattern GC. The gate capping pattern GC may be spaced apart from the topmost end of the upper portion G2*y* of the second electrode G2. The gate capping pattern GC may not be in contact with the topmost end of the upper portion G2*y* of the second electrode G2.

Figure 11A:
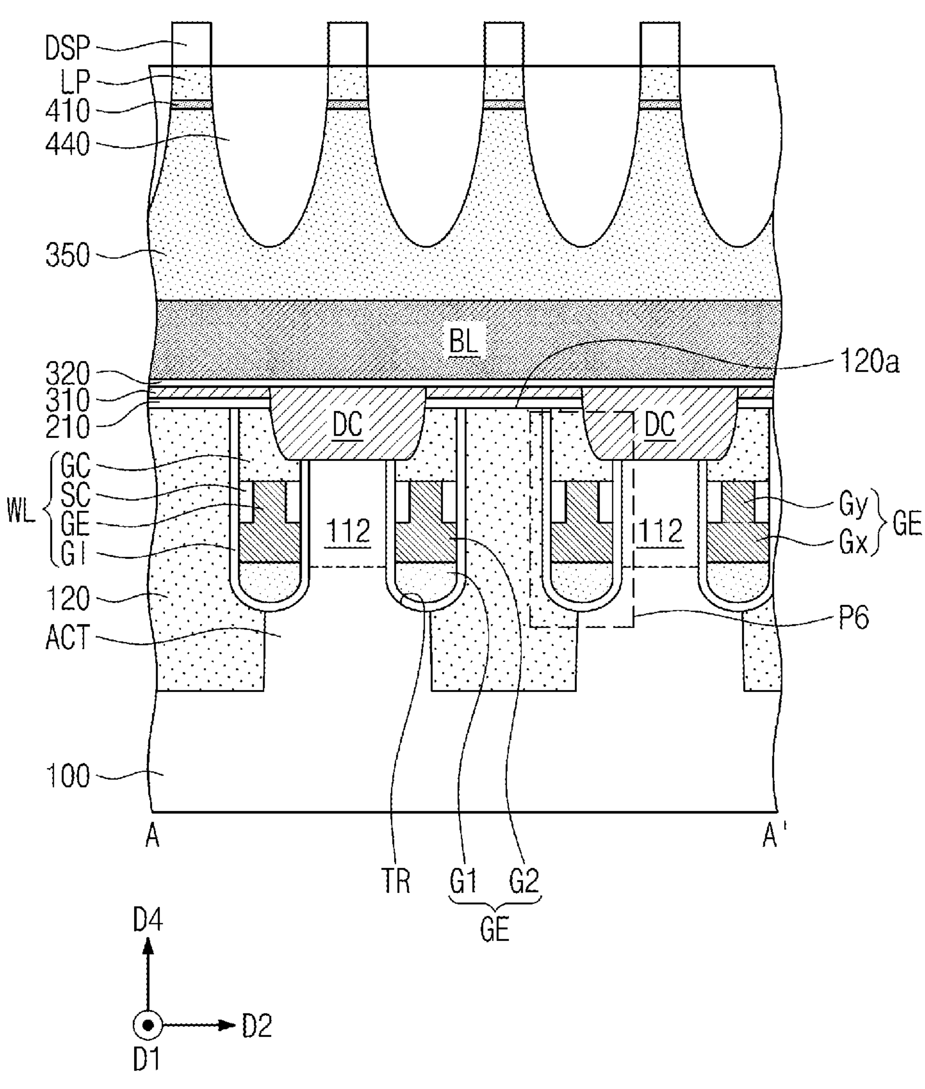
FIGS. 11A and 11B are sectional views, which are respectively taken along the lines A-A' and B-B' of FIG. 2 to illustrate a semiconductor memory device according to some embodiments of the inventive concept.
Figure 11B:
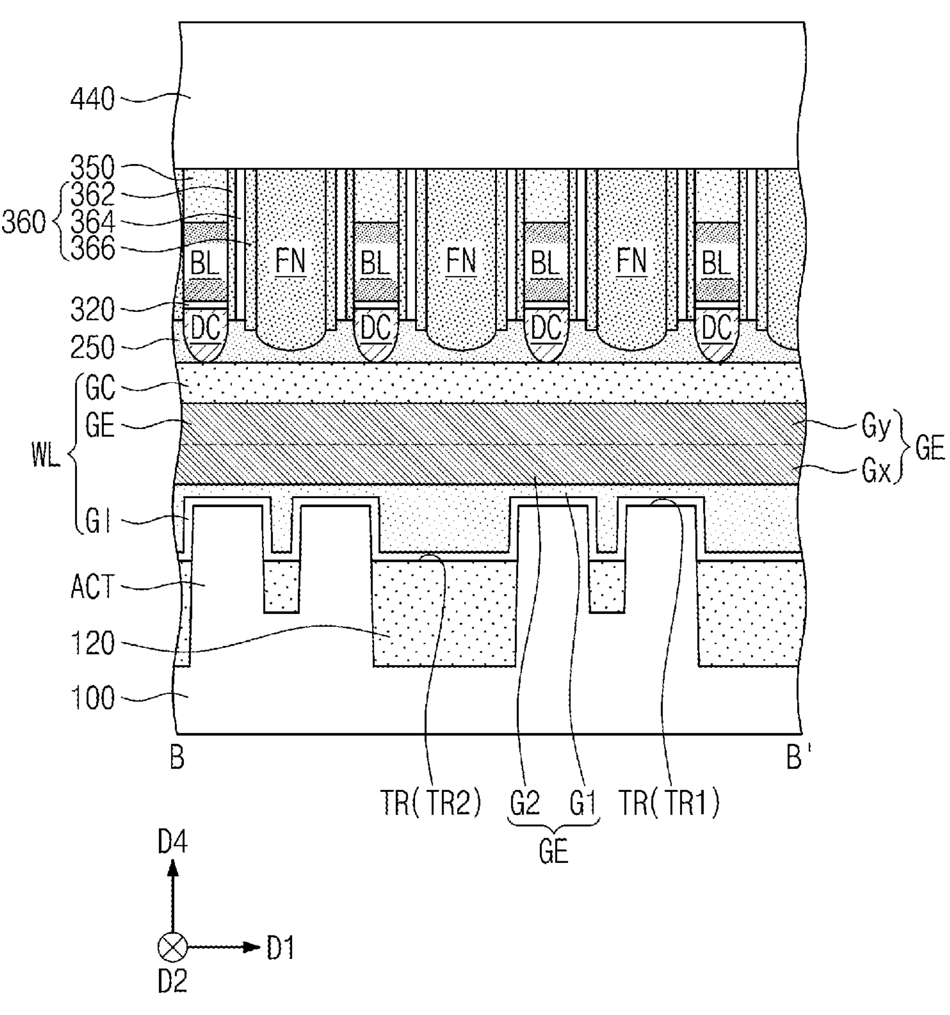
Figure 12:
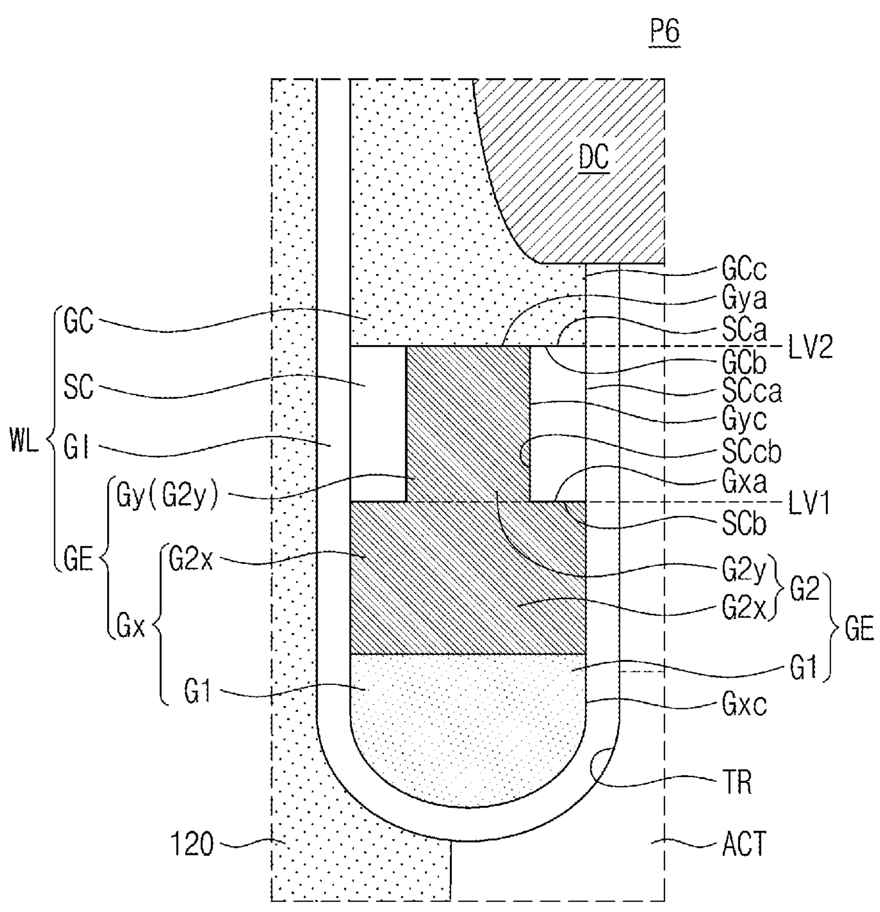
FIG. 12 is an enlarged sectional view illustrating a portion 'P6' of FIG. 11A.

FIGS. 11A and 11B are sectional views, which are respectively taken along the lines A-A' and B-B' of FIG. 2 to illustrate a semiconductor memory device according to some embodiments of the inventive concept. FIG. 12 is an enlarged sectional view illustrating a portion 'P6' of FIG. 11A. Hereinafter, a semiconductor memory device according to some embodiments of the inventive concept will be described with reference to FIGS. 11A to 12. For concise description, a previously-described element may be identified by the same reference number without repeating an overlapping description thereof.

Referring to FIGS. 11A to 12, the gate electrode GE may include the first electrode G1 and the second electrode G2, which are formed of or include different materials from each other. The second electrode G2 may be disposed on the first electrode G1. As an example, the second electrode G2 may be disposed on the top surface of the first electrode G1. The second electrode G2 may include the lower portion G2*x* and the upper portion G2*y*, which are connected to each other at the first level LV1. The lower portion G2*x* of the second electrode G2 may be a portion of the second electrode G2 placed under the first level LV1. The upper portion G2*y* of the second electrode G2 may be the other portion of the second electrode G2 placed on the first level LV1. The top surface of the first electrode G1 may be disposed at a level lower than the first level LV1. When measured in the second direction D2 at the first level LV1, a width of the upper portion G2*y* of the second electrode G2 may be smaller than a width of the lower portion G2*x* of the second electrode G2.

The lower portion G2*x* of the second electrode G2 may be interposed between the upper portion G2*y* of the second electrode G2 and the first electrode G1. The first electrode G1 may not cover or be on a side surface of the lower portion G2*x* of the second electrode G2. The side surface of the lower portion G2*x* of the second electrode G2 may be in contact with the gate insulating pattern GI. A side surface of the upper portion G2*y* of the second electrode G2 may be spaced apart from the gate insulating pattern GI. As an example, the side surface of the upper portion G2*y* of the second electrode G2 may be spaced apart from the gate insulating pattern GI by the side-capping pattern SC. A top surface of the lower portion G2*x* of the second electrode G2 may be covered with the side-capping pattern SC. As an example, the top surface of the lower portion G2*x* of the second electrode G2 may be in contact with the side-capping pattern SC.

FIGS. 13A to 17C are sectional views illustrating a method of fabricating a semiconductor memory device, according to some embodiments of the inventive concept. In detail, FIGS. 13A, 14A, 15A, 16A, and 17A are sectional views corresponding to the line A-A' of FIG. 2. FIGS. 13B, 14B, 15B, 16B, and 17B are sectional views corresponding to the line B-B' of FIG. 2. FIGS. 13C, 14C, 15C, 16C, and 17C are sectional views corresponding to the line C-C' of FIG. 2. Hereinafter, a method of fabricating a semiconductor memory device, according to some embodiments of the inventive concept, will be described with reference to FIGS. 13A to 17C. For concise description, a previously-described element may be identified by the same reference number without repeating an overlapping description thereof.

Figure 13A:
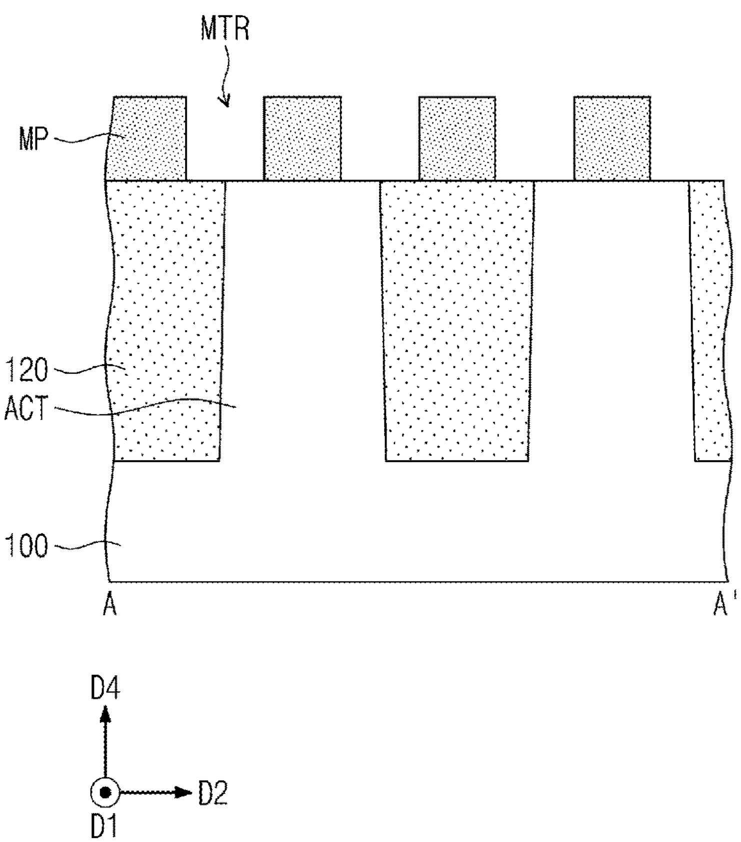
FIGS. 13A, 13B, 13C, 14A, 14B, 14C, 15A, 15B, 15C, 16A, 16B, 16C, 17A, 17B, and 17C are sectional views illustrating a method of fabricating a semiconductor memory device, according to some embodiments of the inventive concept.
Figure 13B:
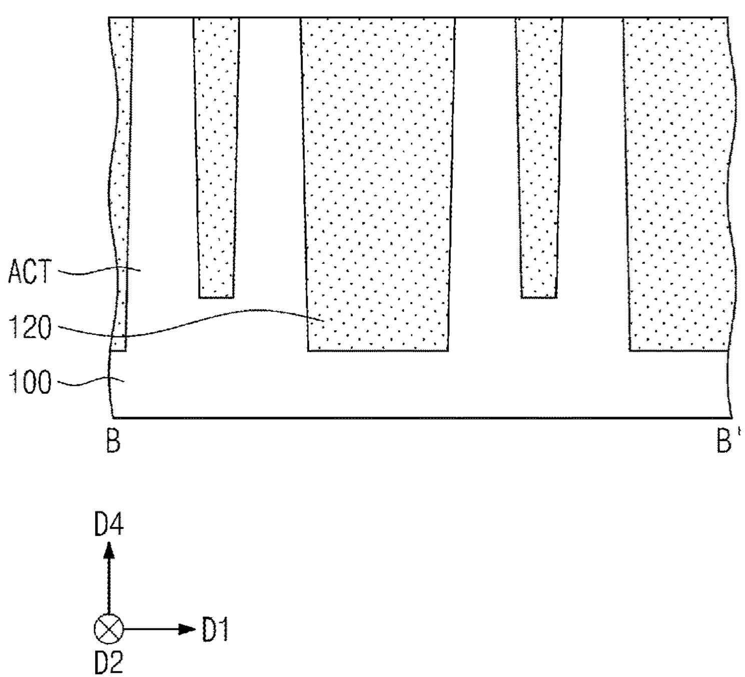
Figure 13C:
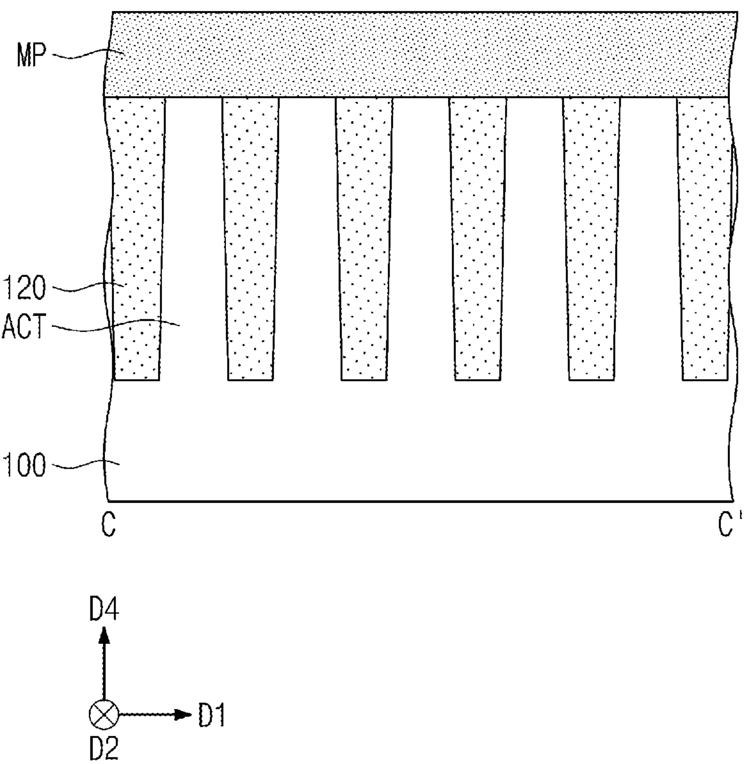

Referring to FIGS. 13A to 13C, the substrate 100 may be prepared. The device isolation pattern 120, which is buried in an upper portion of the substrate 100, may be formed. The formation of the device isolation pattern 120 may include patterning the upper portion of the substrate 100 to form an isolation trench and forming the device isolation pattern 120 to fill the isolation trench. Remaining portions of the upper portion of the substrate 100, which are surrounded by the device isolation pattern 120, may be defined as the active patterns ACT. Impurity regions may be formed in the active patterns ACT. The formation of the impurity regions may include injecting impurities into the active patterns ACT through an ion implantation process.

A mask pattern MP may be formed on the active patterns ACT and the device isolation pattern 120. The mask pattern MP may include line-shaped patterns, which extend in the first direction D1 and are spaced apart from each other in the second direction D2. When viewed in a plan view, the mask pattern MP may cross the active patterns ACT and the device isolation pattern 120 in the first direction D1. Mask trenches MTR may be formed between the line-shaped patterns of the mask pattern MP. The mask trenches MTR may extend in the first direction D1 and may be spaced apart from each other in the second direction D2.

Figure 14A:
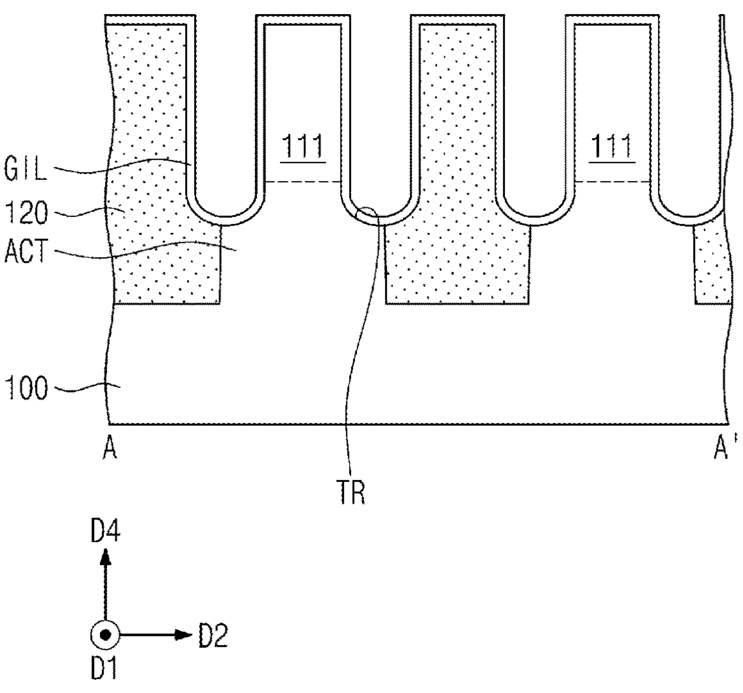
Figure 14B:
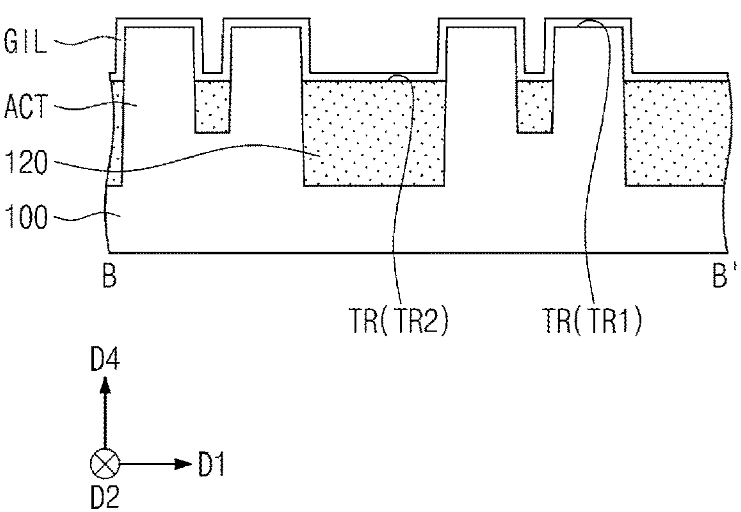
Figure 14C:
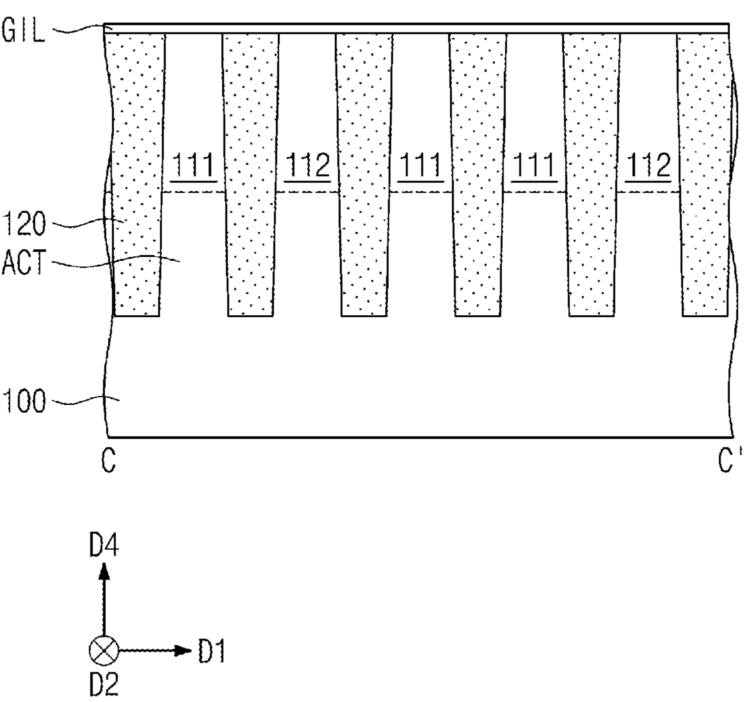

Referring to FIGS. 14A to 14C, upper portions of the active patterns ACT and an upper portion of the device isolation pattern 120 may be etched using the mask pattern MP as an etch mask. Thus, the trench regions TR may be formed to vertically overlap with the mask trenches MTR of the mask pattern MP. The trench regions TR may extend in the first direction D1 and may be spaced apart from each other in the second direction D2. In some embodiments, a pair of the trench regions TR, which are adjacent to each other in the second direction D2, may cross each of the active patterns ACT in the first direction D1.

A bottom surface of each of the trench regions TR may be formed to have a non-flat shape. In some embodiments, the trench region TR may include the first trench region TR1 on the active pattern ACT and the second trench region TR2 on the device isolation pattern 120. A bottom surface of the first trench region TR1 may be formed at a level higher than a bottom surface of the second trench region TR2. Etch rates of the active pattern ACT and the device isolation pattern 120 may be different from each other, when the etching process is performed, and thus, the bottom surfaces of the first and second trench regions TR1 and TR2 may be formed at different levels. As a result, the bottom surface of each of the trench regions TR may have the non-flat shape.

Each of the active patterns ACT may include a pair of edge portions 111 and a center portion 112, which are delimited by the trench regions TR. The pair of edge portions 111 may be defined at opposite edges (e.g., opposing edges) of each of the active patterns ACT. The center portion 112 may be defined between the pair of the trench regions TR (e.g., between the pair of edge portions 111).

A gate insulating layer GIL may be conformally formed on the substrate 100. For example, the gate insulating layer GIL may conformally cover inner surfaces of the trench regions TR and may extend to cover top surfaces of the active patterns ACT and a top surface of the device isolation pattern 120. A bottom surface of the gate insulating layer GIL may have a non-flat shape, due to the shape of the trench region TR. The gate insulating layer GIL may be formed using a physical vapor deposition (PVD) process, a chemical vapor deposition (CVD) process, or an atomic layer deposition (ALD) process. The gate insulating layer GIL may be formed of or include at least one of silicon oxide, high-k dielectric materials, or combinations thereof.

Figure 15A:
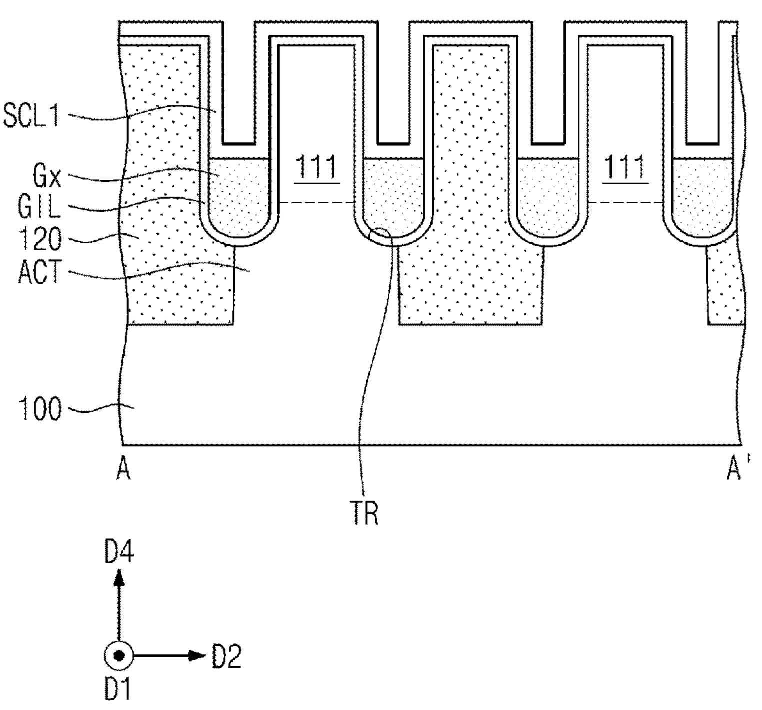
Figure 15B:
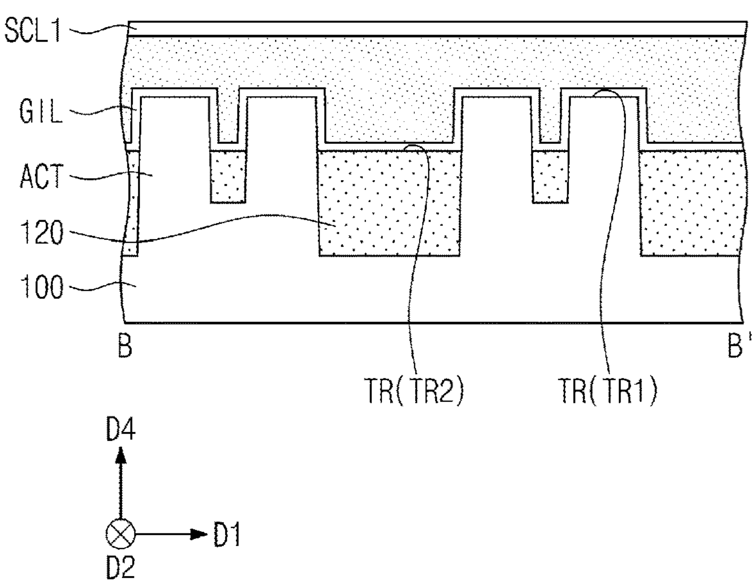
Figure 15C:
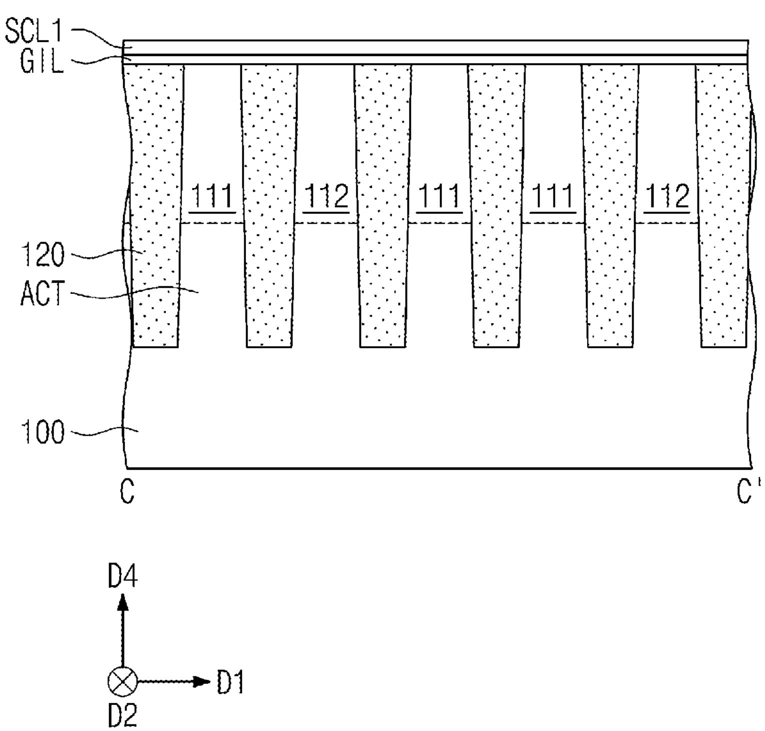

Referring to FIGS. 15A to 15C, the lower portion Gx of the gate electrode GE may be formed in the trench region TR. In some embodiments, the lower portion Gx of the gate electrode GE may be formed in a lower portion of the trench region TR. The formation of the lower portion Gx of the gate electrode GE may include forming a gate lower layer (not shown) to fill the trench regions TR and cover the gate insulating layer GIL and etching an upper portion of the gate lower layer to form the lower portions Gx of the gate electrodes GE that are separated from each other. The formation of the gate lower layer may include performing a physical vapor deposition (PVD) process, a chemical vapor deposition (CVD) process, or an atomic layer deposition (ALD) process. The etching of the upper portion of the gate lower layer may include performing an etch-back process on the gate lower layer. Thus, the lower portion Gx of the gate electrode GE may fill the lower portion of the trench region TR. Since the upper portion of the gate lower layer is etched, an upper portion of the gate insulating layer GIL may be exposed to the outside.

The lower portion Gx of the gate electrode GE may extend along the trench region TR and in the first direction D1. A bottom surface of the lower portion Gx of the gate electrode GE may have a non-flat shape, due to the shape of the bottom surface of the trench region TR. In some embodiments, the top surface of the lower portion Gx of the gate electrode GE may extend to have a flat shape.

A first side-capping layer SCL1 may be conformally formed on the substrate 100. For example, the first side-capping layer SCL1 may be formed to conformally cover or be on the inner surfaces of the trench regions TR and the top surface of the lower portion Gx of the gate electrode GE and may extend to a region on the top surfaces of the active patterns ACT and the top surface of the device isolation pattern 120. In some embodiments, an ion implantation process may be performed, after the formation of the first side-capping layer SCL1. As a result, the first side-capping layer SCL1 may contain impurities. In some other embodiments, impurities may be injected into the first side-capping layer SCL1 during the formation of the first side-capping layer SCL1.

Figure 16A:
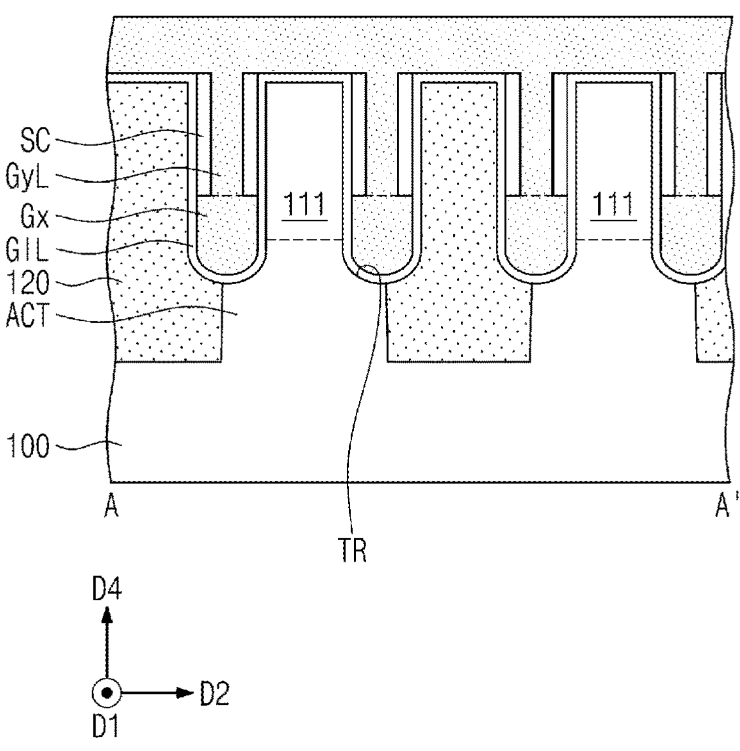
Figure 16B:
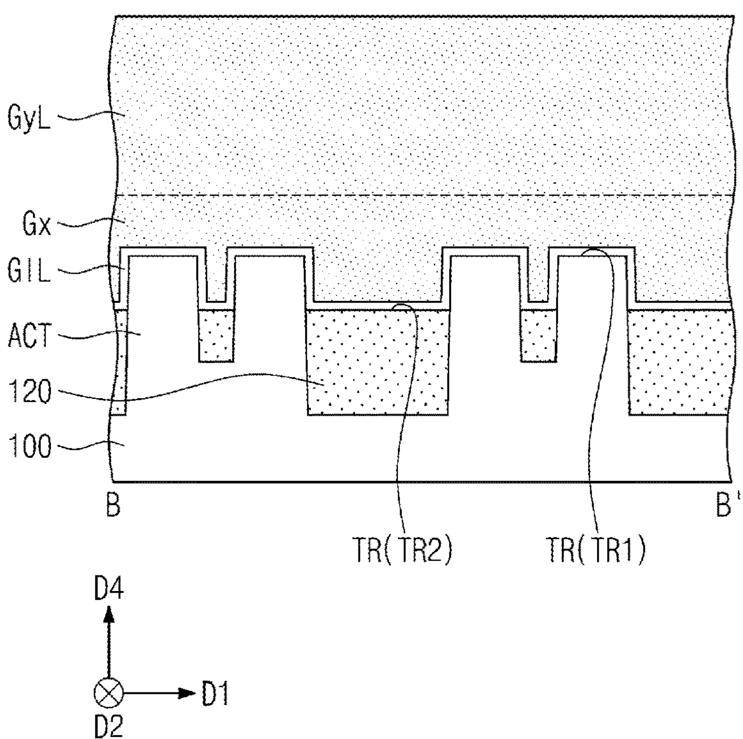
Figure 16C:
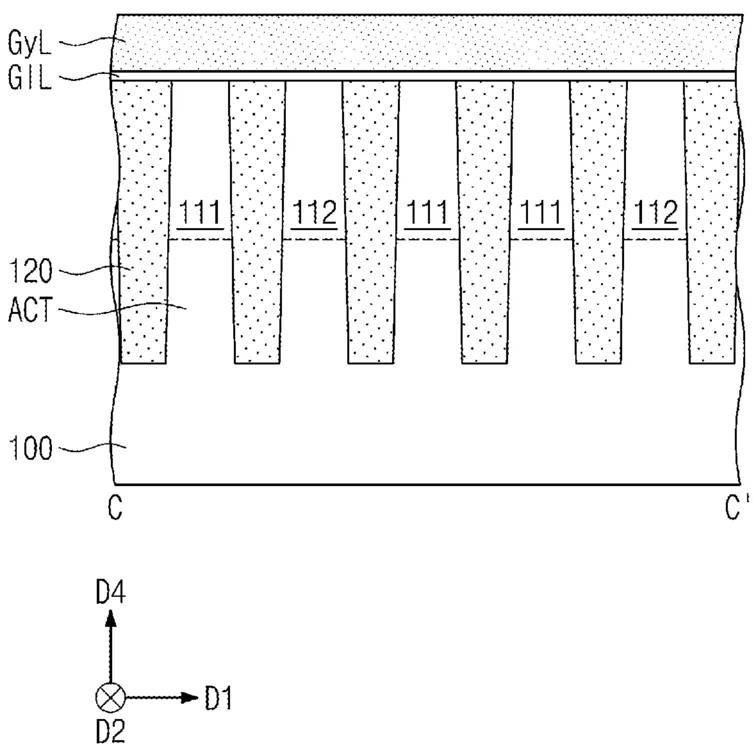

Referring to FIGS. 16A to 16C, the side-capping pattern SC may be formed on the lower portion Gx of the gate electrode GE to cover or be on an inner side surface of the trench region TR. The formation of the side-capping pattern SC may include etching the first side-capping layer SCL1 on the top surfaces of the active patterns ACT and the top surface of the device isolation pattern 120. Here, the first side-capping layer SCL1 may be further etched on the top surface of the lower portion Gx of the gate electrode GE, and in this case, a portion of the top surface of the lower portion Gx of the gate electrode GE may be exposed to the outside.

A gate upper layer GyL may be formed on the substrate 100. The gate upper layer GyL may fill the trench regions TR. The gate upper layer GyL may be formed to cover or be on the top surfaces of the active patterns ACT and the top surface of the device isolation pattern 120. The gate upper layer GyL may be interposed between the side-capping patterns SC, which are disposed in each of the trench regions TR. The gate upper layer GyL may be in contact with the exposed top surface of the lower portion Gx of the gate electrode GE.

Figure 17A:
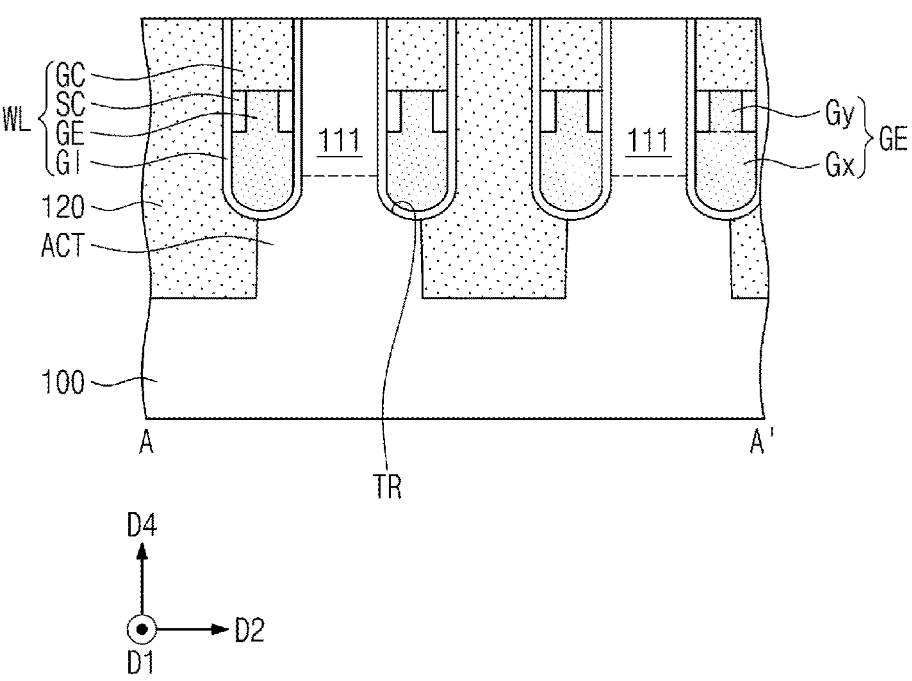
Figure 17B:
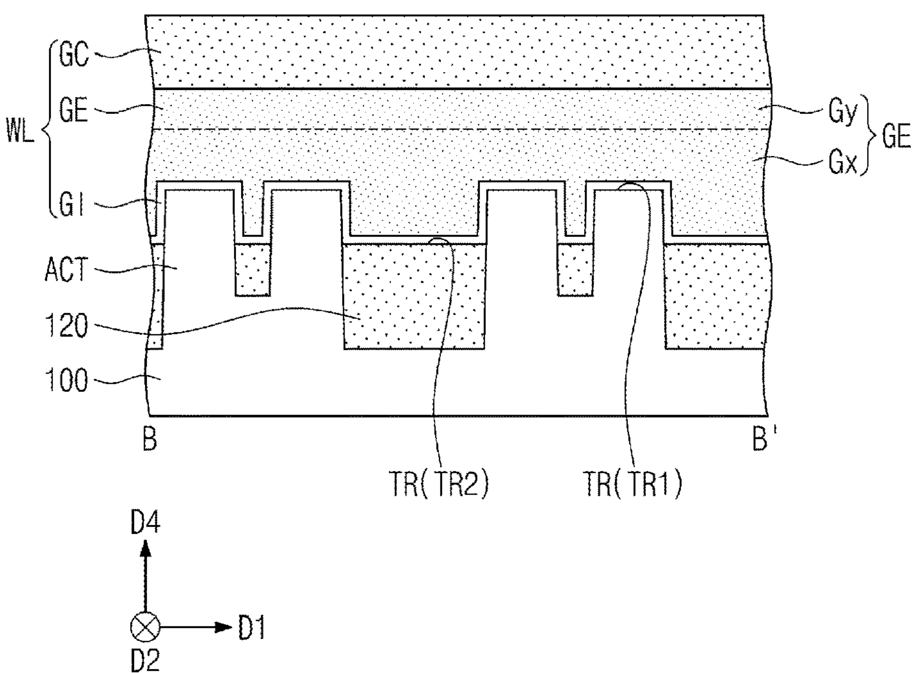
Figure 17C:
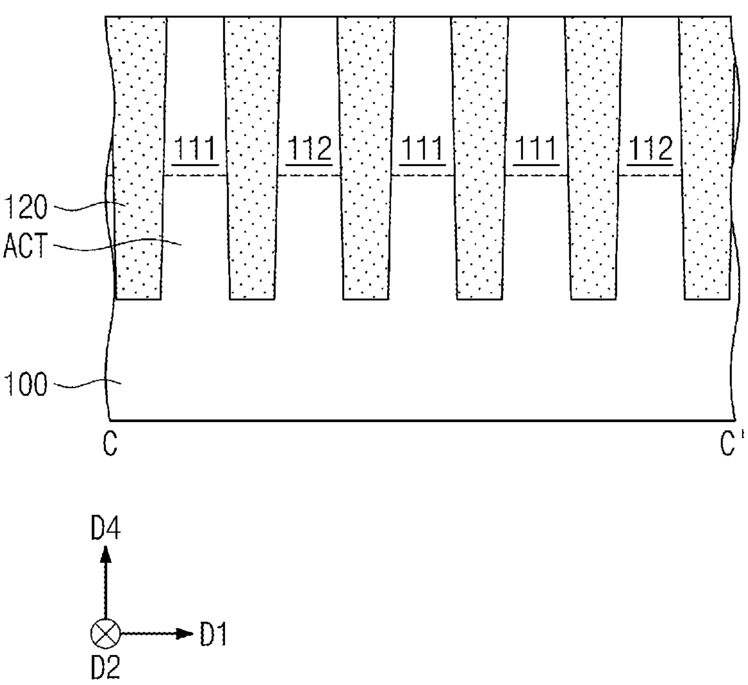

Referring to FIGS. 17A to 17C, the upper portion Gy of the gate electrode GE may be formed. The formation of the upper portion Gy of the gate electrode GE may include etching an upper portion of the gate upper layer GyL. A remaining portion of the gate upper layer GyL, which is left after the etching process, may constitute the upper portion Gy of the gate electrode GE. The etching of the upper portion of the gate upper layer GyL may include performing an etch-back process on the gate upper layer GyL.

During the etching process, an upper portion of the side-capping pattern SC may be further etched. Thus, a length of the side-capping pattern SC in the fourth direction D4 may be reduced. After the etching process, the top surface of the side-capping pattern SC may be located at the same level as the top surface of the upper portion Gy of the gate electrode GE and may be coplanar with the top surface of the upper portion Gy of the gate electrode GE.

Thereafter, the gate capping pattern GC may be formed on the upper portion Gy of the gate electrode GE. The gate capping pattern GC may fill remaining portions of the trench regions TR, respectively. The formation of the gate capping pattern GC may include forming a gate capping layer (not shown) to fill a remaining portion of the trench region TR and cover or be on the top surfaces of the active patterns ACT and the top surface of the device isolation pattern 120 and removing an upper portion of the gate capping layer to form the gate capping patterns GC which are separated from each other.

The gate insulating pattern GI may be formed by removing an upper portion of the gate insulating layer GIL. In detail, portions of the gate insulating layer GIL may be removed from the top surfaces of the active patterns ACT and the top surface of the device isolation pattern 120, and in this case, remaining portions of the gate insulating layer GIL may constitute the gate insulating patterns GI. The gate insulating pattern GI may conformally cover or be on an inner surface of the trench region TR.

The gate electrode GE, the gate insulating pattern GI, the gate capping pattern GC, and the side-capping pattern SC may constitute the word line WL.

Referring back to FIGS. 3A to 4, a buffer layer (not shown) and a poly-silicon layer (not shown) may be formed to cover or be on the active patterns ACT and the device isolation pattern 120, and then, the first recess region RS1 may be formed in an upper portion of each of the active patterns ACT and the device isolation pattern 120. Here, the buffer layer and the poly-silicon layer may be partially removed to form the buffer pattern 210 and the polysilicon pattern 310.

The bit line contact DC, the first barrier pattern 320, the bit line BL, and the bit line capping pattern 350 may be formed on the first recess region RS1. The formation of the bit line contact DC, the first barrier pattern 320, the bit line BL, and the bit line capping pattern 350 may include forming a bit line contact layer (not shown) to fill the first recess region RS1, sequentially forming a first barrier layer (not shown), a bit line layer (not shown), and a bit line capping layer (not shown) on the bit line contact layer, and etching the bit line contact layer, the first barrier layer, the bit line layer, and the bit line capping layer to form the bit line contact DC, the first barrier pattern 320, the bit line BL, and the bit line capping pattern 350. Here, a portion of the polysilicon pattern 310 may be further etched. During this process, an inner portion of the first recess region RS1 may be partially exposed to the outside. Thereafter, the gapfill insulating pattern 250 may be formed to fill a remaining portion of the first recess region RS1. The first ohmic pattern (not shown) may be additionally formed between the bit line BL and the bit line contact DC and between the bit line BL and the polysilicon pattern 310, during the process of forming the bit line BL.

The bit line spacer 360 may be formed to cover or be on a side surface of the bit line BL and a side surface of the bit line capping pattern 350. The formation of the bit line spacer 360 may include sequentially forming the first spacer 362, the second spacer 364, and the third spacer 366 to conformally cover or be on the side surface of the bit line BL and the bit line capping pattern 350.

The storage node contacts BC and the fence patterns FN may be formed between adjacent ones of the bit lines BL. The storage node contacts BC and the fence patterns FN may be alternately arranged in the second direction D2. Each of the storage node contacts BC may be formed to fill the second recess region RS2 and may be electrically connected to a corresponding edge portion 111 of the active pattern ACT in the second recess region RS2. The fence patterns FN may be formed at positions that vertically overlap with the word lines WL. In some embodiments, the storage node contacts BC may be formed first, and then the fence patterns FN may be formed between the storage node contacts BC. In some other embodiments, the fence patterns FN may be formed first, and then the storage node contacts BC may be formed between the fence patterns FN.

An upper portion of the bit line spacer 360 may be partially removed during the formation of the storage node contacts BC. In this case, the capping spacer 370 may be additionally formed in a region, which is formed by removing the bit line spacer 360. Next, the second barrier pattern 410 may be formed to conformally cover or be on the bit line spacer 360, the capping spacer 370, and the storage node contacts BC.

The landing pads LP may be formed on the storage node contacts BC. The formation of the landing pads LP may include sequentially forming a landing pad layer (not shown) and mask patterns (not shown) to cover top surfaces of the storage node contacts BC and dividing the landing pad layer into a plurality of landing pads LP through an anisotropic etching process using the mask patterns as an etch mask. The second barrier pattern 410, the bit line spacer 360, and the bit line capping pattern 350 may be partially etched through the etching process and may be exposed to the outside. An upper portion of the landing pad LP may be shifted or offset from the storage node contact BC in the first direction D1.

In some embodiments, the etching process on the landing pad layer may be performed to expose the second spacer 364. The second spacer 364 may be further etched through the exposed portion of the second spacer 364, and in this case, a final structure of the second spacer 364 may include an air gap. However, the inventive concept is not limited to this example.

Thereafter, the filler pattern 440 may be formed to cover or be on the exposed portions and to surround each of the landing pads LP, and the data storage patterns DSP may be formed on the landing pads LP, respectively.

FIGS. 18A to 22 are sectional views illustrating a method of fabricating a semiconductor memory device, according to some embodiments of the inventive concept. In detail, FIGS. 18A, 19A, 20A, 21, and 22 are sectional views corresponding to the line A-A' of FIG. 2. FIGS. 18B, 19B, and 20B are sectional views corresponding to the line B-B' of FIG. 2. For concise description, a previously-described element may be identified by the same reference number without repeating an overlapping description thereof.

Figure 18A:
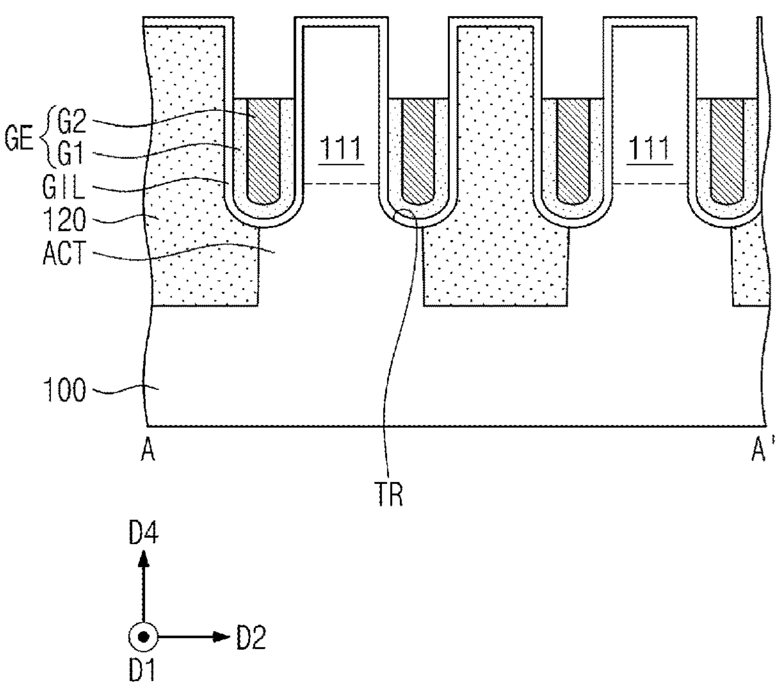
FIGS. 18A, 18B, 19A, 19B, 20A, 20B, 21, and 22 are sectional views illustrating a method of fabricating a semiconductor memory device, according to some embodiments of the inventive concept.
Figure 18B:
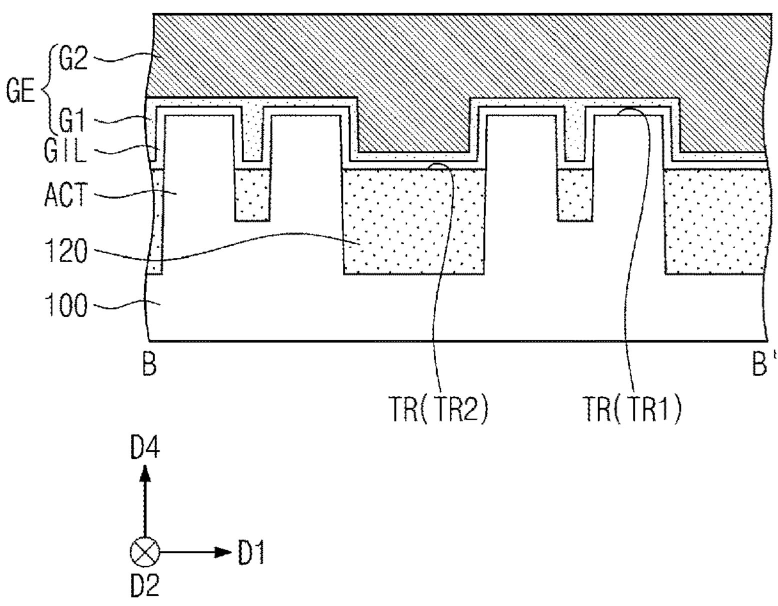

Referring to FIGS. 18A and 18B, the first and second electrodes G1 and G2 of the gate electrode GE may be formed in the trench region TR, after the formation of the gate insulating layer GIL described with reference to FIG. 14A. The formation of the first and second electrodes G1 and G2 of the gate electrode GE may include forming a first electrode layer (not shown) to conformally cover or be on inner surfaces of the trench regions TR, top surfaces of the active patterns ACT, and a top surface of the device isolation pattern 120, forming a second electrode layer (not shown) to fill the remaining portion of the trench regions TR and to cover or be on the first electrode layer, and removing upper portions of the first and second electrode layers.

A remaining portion of the first electrode layer may constitute the first electrode G1. A remaining portion of the second electrode layer may constitute the second electrode G2. The removing of the upper portions of the first and second electrode layers may include performing an etch-back process on them. In some embodiments, the top surfaces of the first and second electrodes G1 and G2 may be located at the same level.

Figure 19A:
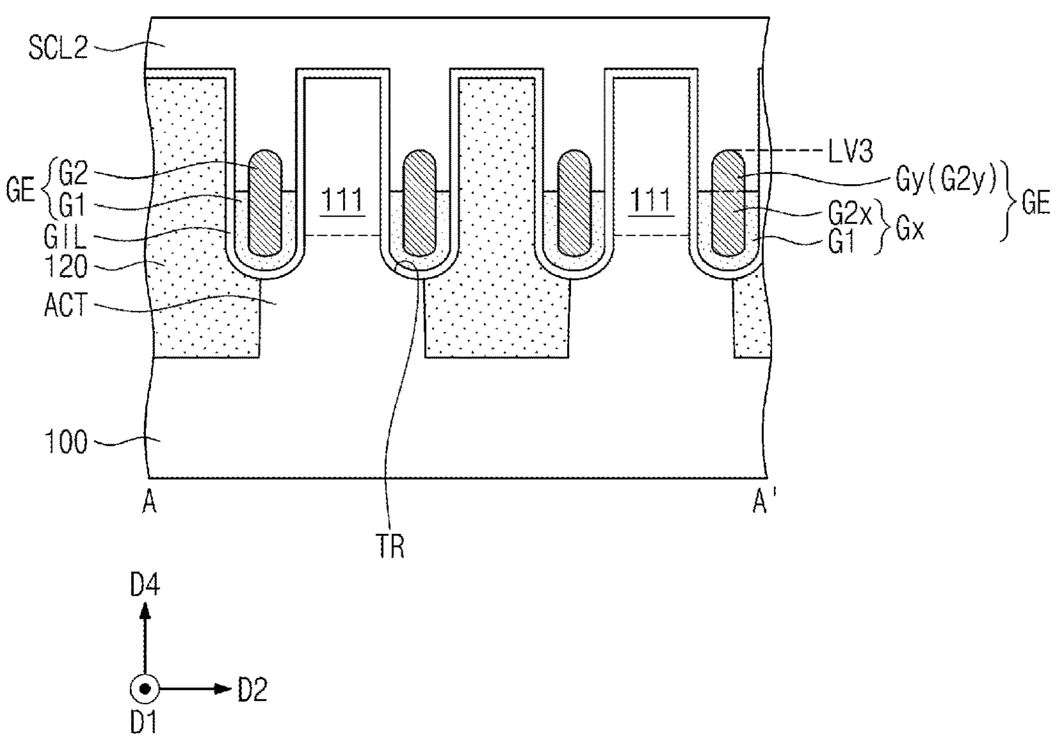
Figure 19B:
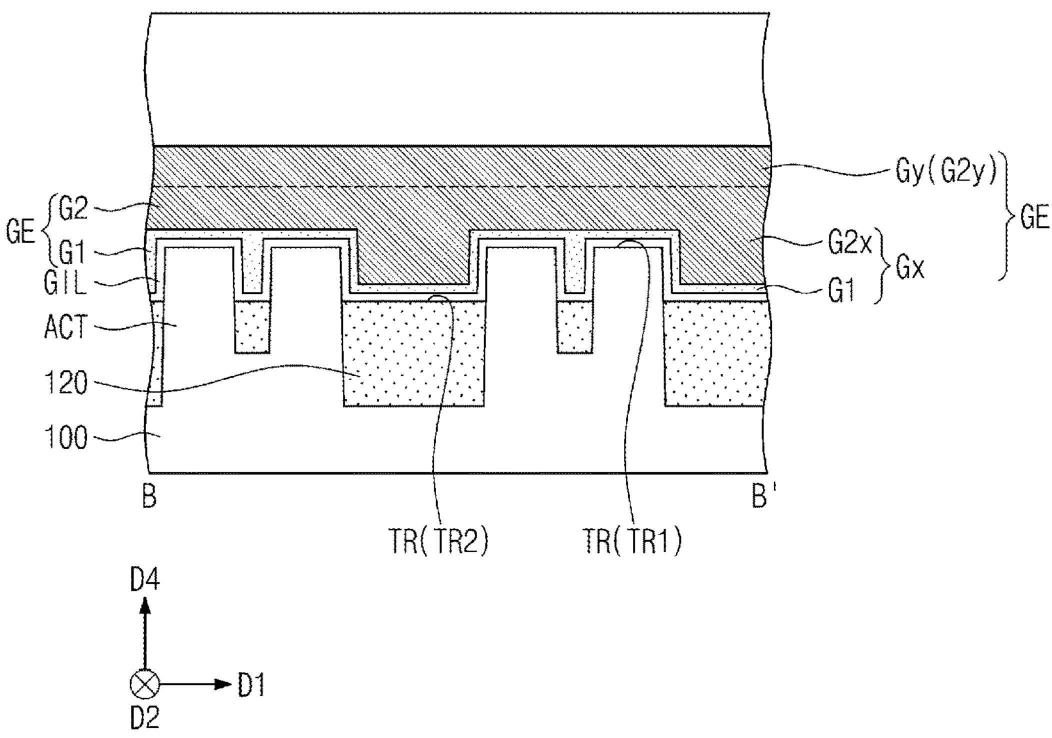

Referring to FIGS. 19A and 19B, an upper portion of the first electrode G1 may be recessed. This process may include etching the upper portion of the first electrode G1.

During this process, an upper portion of the second electrode G2 may also be etched, and in this case, the topmost end of the second electrode G2 may be rounded. Here, a level, at which the topmost end of the second electrode G2 is located, may be defined as a third level LV3. The top surface of the first electrode G1 may be formed at a level that is lower than the topmost end of the second electrode G2 (i.e., than the third level LV3).

Thereafter, a second side-capping layer SCL2 may be formed on the substrate 100. The second side-capping layer SCL2 may fill a remaining portion of the trench region TR and may cover or be on the top surfaces of the active patterns ACT and the top surface of the device isolation pattern 120. In some embodiments, impurities may be injected into the second side-capping layer SCL2 when the second side-capping layer SCL2 is formed. In some other embodiments, an ion implantation process may be performed, after the formation of the second side-capping layer SCL2.

Figure 20A:
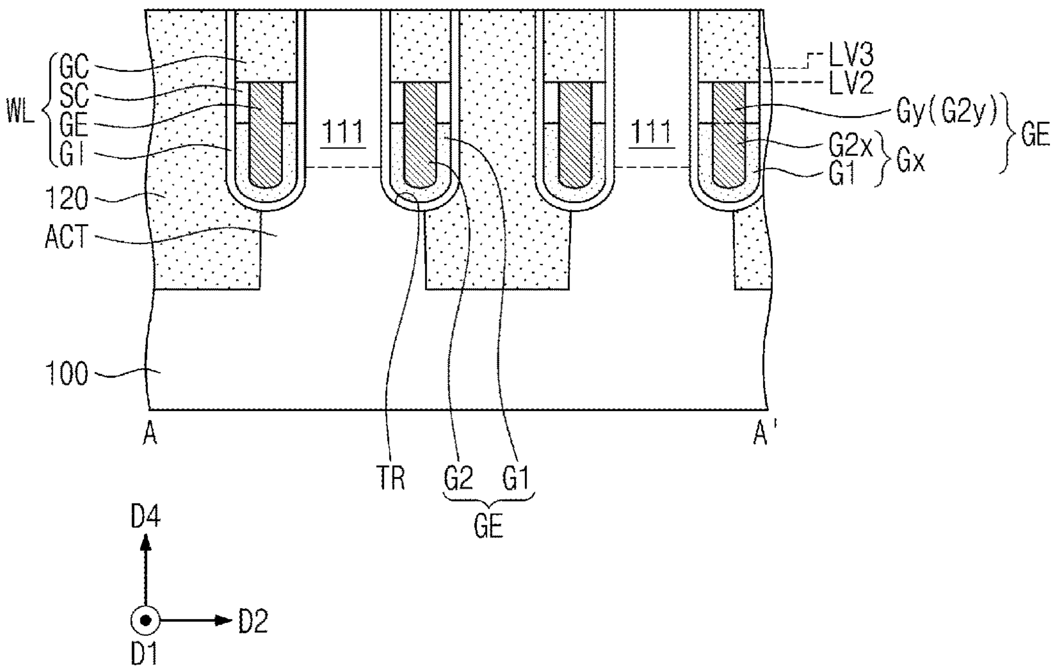
Figure 20B:
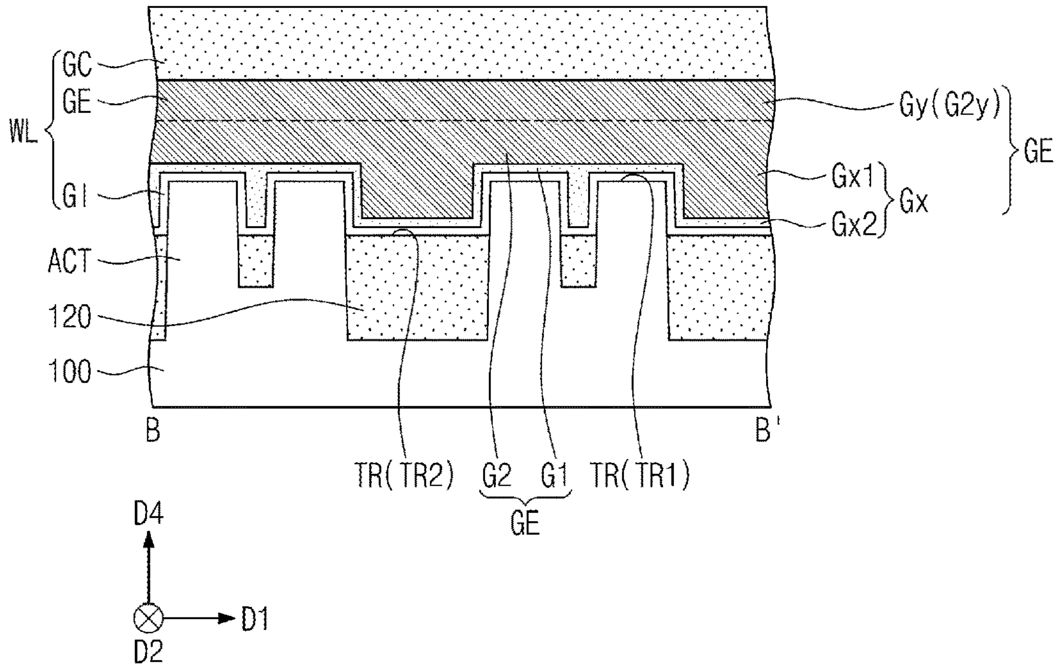

Referring to FIGS. 20A and 20B, the side-capping pattern SC may be formed. The formation of the side-capping pattern SC may include etching an upper portion of the second side-capping layer SCL2. The top surface of the side-capping pattern SC may be formed at a level lower than the third level LV3. That is, the second level LV2 may be lower than the third level LV3.

An upper portion of the second electrode G2 may be further etched, when the side-capping pattern SC is formed. Accordingly, a top surface of the second electrode G2 may be formed at a level lower than the third level LV3. As an example, the top surface of the second electrode G2 may be formed at the second level LV2. The top surface of the second electrode G2 may be coplanar with the top surface of the side-capping pattern SC. The top surface of the second electrode G2 may be a flat surface that extends in the second direction D2.

The gate capping pattern GC may be formed on the top surface of the second electrode G2. The gate capping pattern GC may be formed by a process that is similar to the process described with reference to FIGS. 17A to 17C. Thereafter, a semiconductor memory device may be fabricated through a process that is similar to that described with reference to FIGS. 3A to 4. In this case, the semiconductor memory device may have the structure described with reference to FIGS. 5A to 6.

Figure 21:
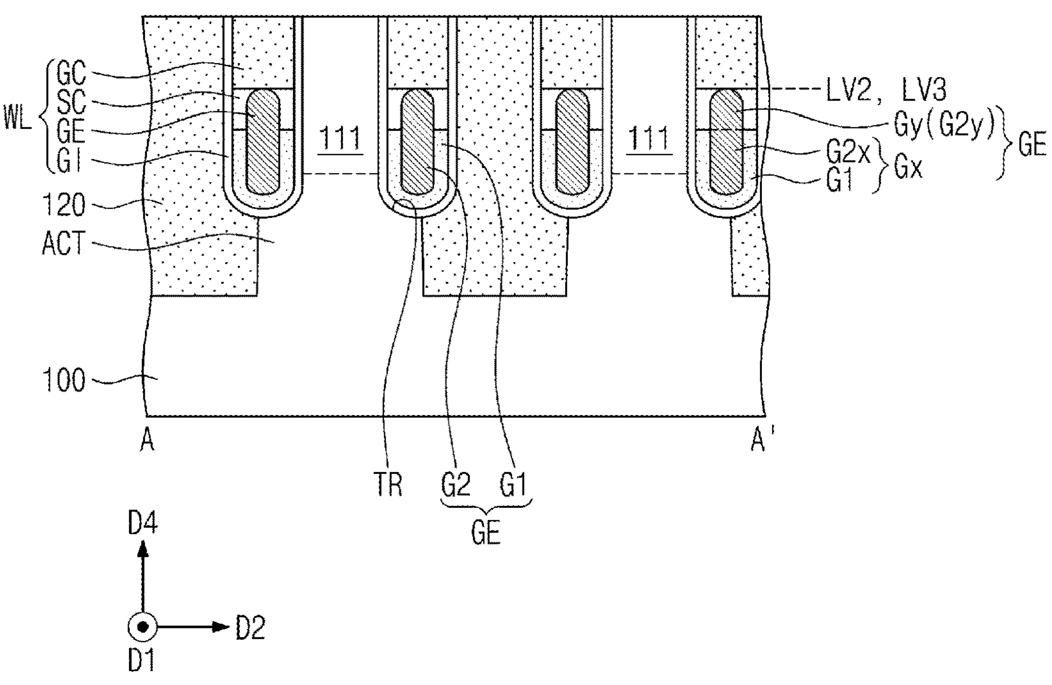
Figure 22:
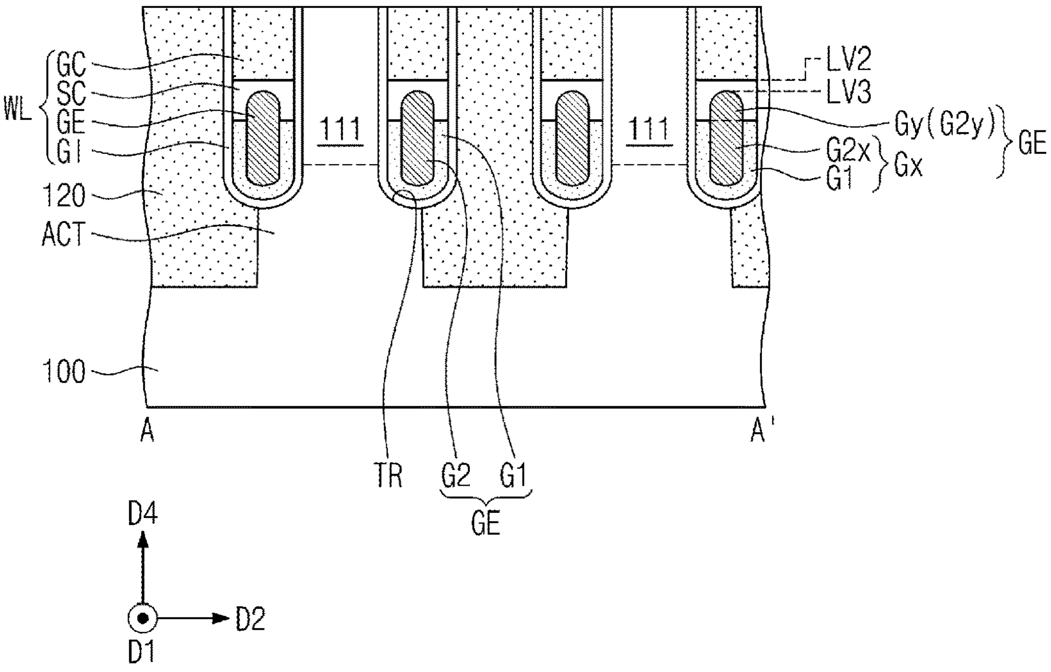

Referring to FIGS. 21 and 22, the rounded topmost end of the second electrode G2 may be left, after the formation of the side-capping pattern SC described with reference to FIG. 20A.

Referring to FIG. 21, the top surface of the side-capping pattern SC may be formed at the third level LV3. That is, the second level LV2 may be defined as substantially the same level as the third level LV3. In this case, the semiconductor memory device may be formed to have the structure described with reference to FIGS. 7A to 8.

Referring to FIG. 22, the top surface of the side-capping pattern SC may be formed at a level higher than the third level LV3. That is, the second level LV2 may be defined as a level higher than the third level LV3. In this case, the semiconductor memory device may be formed to have the structure described with reference to FIGS. 9A to 10.

Figure 23A:
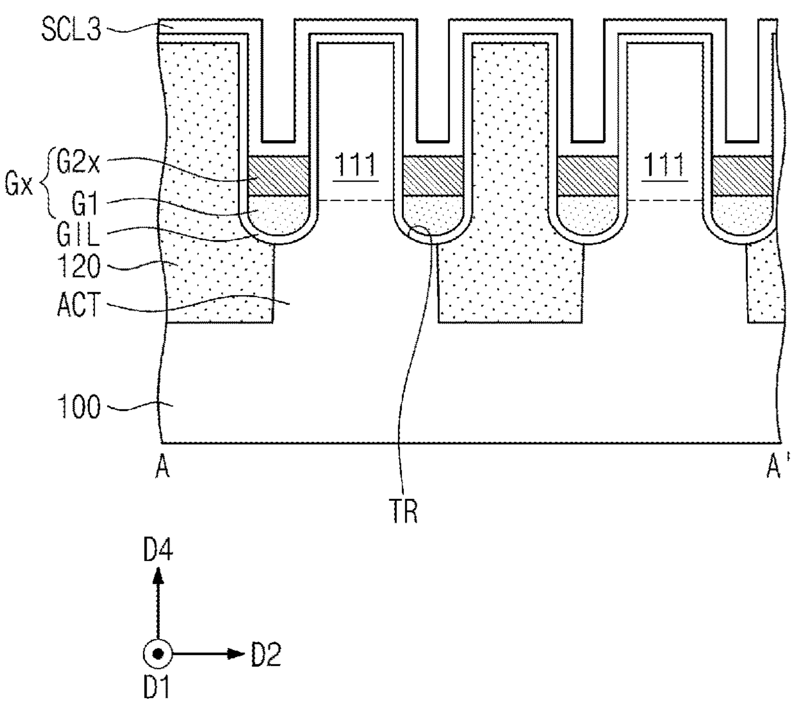
FIGS. 23A, 23B, 24A, 24B, 25A, and 25B are sectional views illustrating a method of fabricating a semiconductor memory device, according to some embodiments of the inventive concept.
Figure 23B:
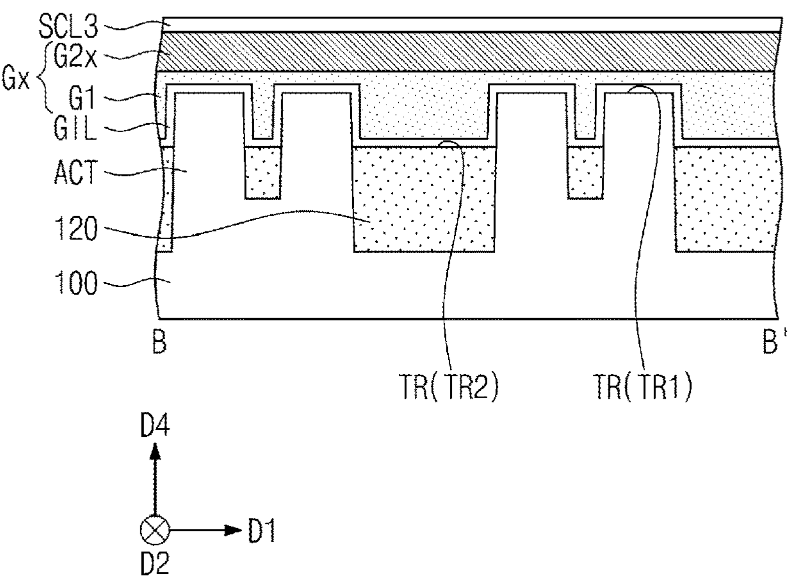
Figure 24A:
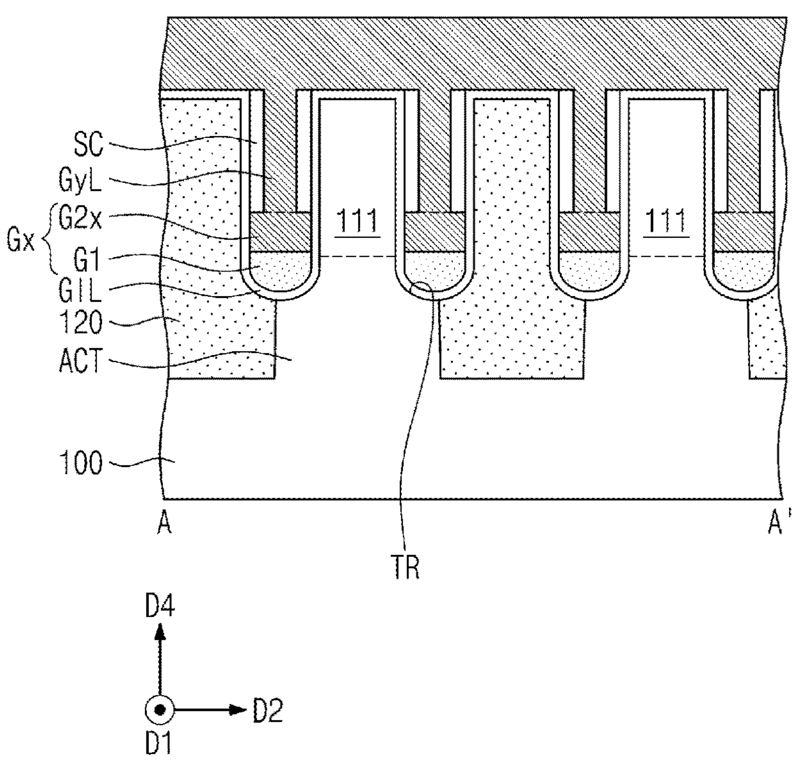
Figure 24B:
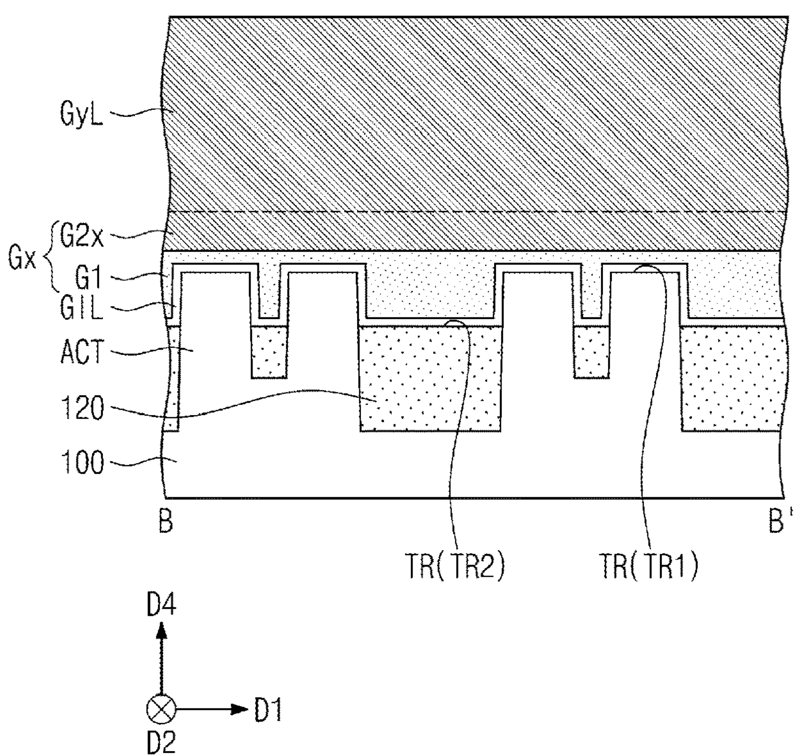
Figure 25A:
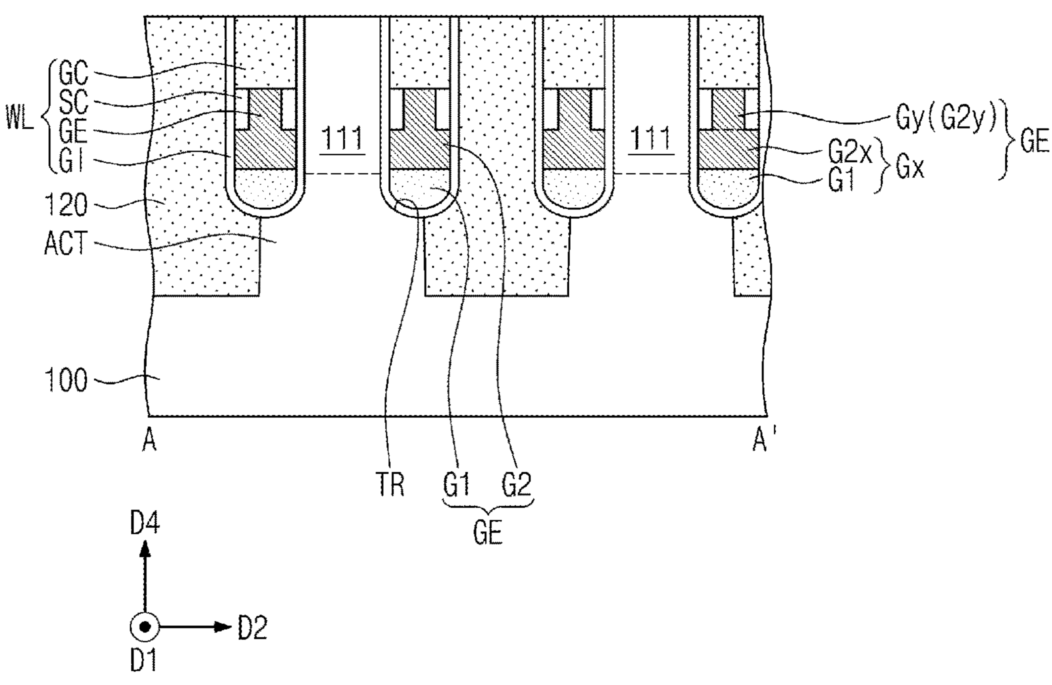
Figure 25B:
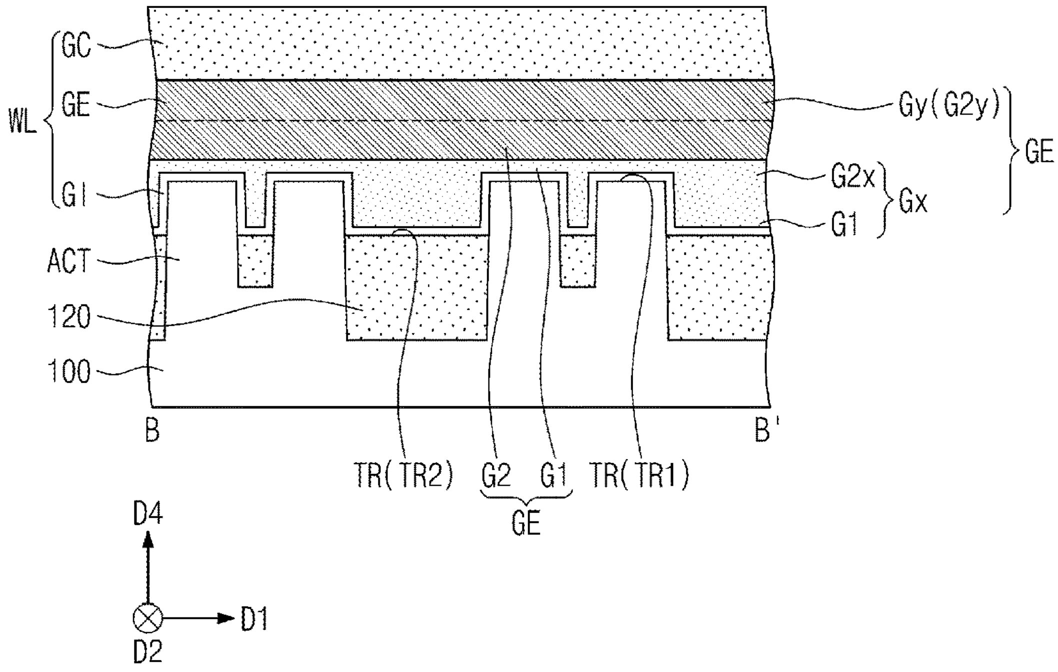

FIGS. 23A to 25B are sectional views illustrating a method of fabricating a semiconductor memory device, according to some embodiments of the inventive concept. In detail, FIGS. 23A, 24A, and 25A are sectional views corresponding to the line A-A' of FIG. 2. FIGS. 23B, 24B, and 25B are sectional views corresponding to the line B-B' of FIG. 2. For concise description, a previously-described element may be identified by the same reference number without repeating an overlapping description thereof.

Referring to FIGS. 23A and 23B, the lower portion Gx of the gate electrode GE may be formed in the trench region TR, after the formation of the gate insulating layer GIL described with reference to FIG. 14A. The formation of the lower portion Gx of the gate electrode GE may include forming the first electrode G1 and forming the lower portion G2$x$ of the second electrode G2 on the first electrode G1.

The formation of the first electrode G1 may include forming a first electrode layer (not shown) to fill the trench regions TR and to cover or be on the active patterns ACT and the device isolation pattern 120 and etching an upper portion of the first electrode layer. The formation of the first electrode layer may include performing a physical vapor deposition (PVD) process, a chemical vapor deposition (CVD) process, or an atomic layer deposition (ALD) process. The etching of the upper portion of the first electrode layer may include performing an etch-back process on the first electrode layer.

For example, the formation of the lower portion G2$x$ of the second electrode G2 may include performing a selective growth process, in which the top surface of the first electrode G1 is used as a seed. Thus, the lower portion G2$x$ of the second electrode G2 may be locally formed on the top surface of the first electrode G1, not on the top surfaces of the active patterns ACT and the top surface of the device isolation pattern 120. Alternatively, the formation of the lower portion G2$x$ of the second electrode G2 may include forming a second electrode layer (not shown) to fill the trench regions TR and cover or be on the active patterns ACT and the device isolation pattern 120 and etching an upper portion of the second electrode layer.

Thereafter, a third side-capping layer SCL3 may be conformally formed on the substrate 100. The formation of the third side-capping layer SCL3 may be similar to the process of forming the first side-capping layer SCL1 of FIG. 15A.

Referring to FIGS. 24A and 24B, the side-capping pattern SC may be formed on the lower portion G2$x$ of the second electrode G2 to cover or be on an inner side surface of the trench region TR. A process of forming the side-capping pattern SC may be similar to the process of forming the side-capping pattern SC, described with reference to FIG. 16A.

The gate upper layer GyL may be formed on the substrate 100. The gate upper layer GyL may be formed of or include the same material as the lower portion G2$x$ of the second electrode G2. In some embodiments, the gate upper layer GyL may be connected to the second electrode G2 without any interface therebetween, but the inventive concept is not limited to this example.

Referring to FIGS. 25A and 25B, the upper portion Gy of the gate electrode GE and the gate capping pattern GC may be formed. A process of forming the upper portion Gy of the gate electrode GE and the gate capping pattern GC may be similar to the process of forming the upper portion Gy of the gate electrode GE and the gate capping pattern GC, described with reference to FIG. 17A.

Thereafter, a semiconductor memory device may be fabricated through a process that is similar to that described with reference to FIGS. 3A to 4. In this case, the semiconductor memory device may have the structure described with reference to FIGS. 11A to 12.

According to some embodiments of the inventive concept, a side-capping pattern may be locally provided on a side surface of a gate electrode, and thus, the gate electrode may be provided over a wider region. This may make it possible to improve both the electrical and reliability characteristics of a semiconductor memory device.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

While example embodiments of the inventive concept have been particularly shown and described, it will be understood by one of ordinary skill in the art that variations in form and detail may be made therein without departing from the scope of the attached claims.

What is claimed is:

1. A semiconductor memory device, comprising:

an active pattern on a substrate and at least partially surrounded by a device isolation pattern;

a gate electrode that crosses the active pattern in a first direction parallel to a bottom surface of the substrate, the gate electrode comprising lower and upper portions; and a side-capping pattern on a top surface of the lower portion of the gate electrode, wherein the gate electrode includes a first conductive material, wherein the side-capping pattern includes a second conductive material, wherein a work function of the second conductive material is greater than a work function of the first conductive material, wherein the side-capping pattern is on a side surface of the upper portion of the gate electrode, and wherein a top surface of the side-capping pattern is located at a level lower than an uppermost surface of the device isolation pattern, relative to the bottom surface of the substrate where the bottom surface of the substrate is a base reference layer.

2. The semiconductor memory device of claim 1, wherein the lower and upper portions of the gate electrode are in contact with each other at a first level, wherein a width in a second direction of the lower portion of the gate electrode at the first level is larger than a width in the second direction of the upper portion of the gate electrode at the first level, and wherein the second direction is parallel to the bottom surface of the substrate and intersects the first direction.

3. The semiconductor memory device of claim 1, wherein the side-capping pattern has an outer side surface that is aligned with a side surface of the lower portion of the gate electrode in a second direction, and wherein the second direction is parallel to the bottom surface of the substrate and intersects the first direction.

4. The semiconductor memory device of claim 1, wherein a side surface of the lower portion of the gate electrode is free of the side-capping pattern thereon.

5. The semiconductor memory device of claim 1, wherein the second conductive material comprises doped polysilicon.

6. The semiconductor memory device of claim 1, wherein the top surface of the side-capping pattern is located at a level that is higher than or equal to a top surface of the upper portion of the gate electrode, relative to the bottom surface of the substrate where the bottom surface of the substrate is the base reference layer.

7. The semiconductor memory device of claim 1, wherein the top surface of the side-capping pattern is coplanar with a top surface of the upper portion of the gate electrode.

8. The semiconductor memory device of claim 1, wherein the side-capping pattern is on a top surface of the upper portion of the gate electrode.

9. The semiconductor memory device of claim 1, wherein the gate electrode comprises a first electrode and a second electrode which include different materials from each other, wherein the lower portion of the gate electrode comprises the first electrode and a lower portion of the second electrode, and wherein the upper portion of the gate electrode comprises an upper portion of the second electrode.

10. The semiconductor memory device of claim 9, wherein the first electrode is between the second electrode and the active pattern.

11. The semiconductor memory device of claim 9, wherein the first electrode at least partially surrounds the lower portion of the second electrode.

12. The semiconductor memory device of claim 9, wherein the second electrode is on a top surface of the first electrode.

13. A semiconductor memory device, comprising:

an active pattern on a substrate and at least partially surrounded by a device isolation pattern;

a gate electrode that crosses the active pattern in a first direction parallel to a bottom surface of the substrate, the gate electrode comprising lower and upper portions;

a gate insulating pattern that extends into a space between the gate electrode and the active pattern; and a side-capping pattern between the upper portion of the gate electrode and the gate insulating pattern, wherein the gate electrode includes a first conductive material, wherein the side-capping pattern includes a second conductive material, wherein a work function of the second conductive material is greater than a work function of the first conductive material, and wherein a top surface of the side-capping pattern is located at a level lower than an uppermost surface of the device isolation pattern, relative to the bottom surface of the substrate where the bottom surface of the substrate is a base reference layer.

14. The semiconductor memory device of claim 13, wherein the side-capping pattern does not extend between the lower portion of the gate electrode and the gate insulating pattern.

15. The semiconductor memory device of claim 13, wherein the upper portion of the gate electrode and the gate insulating pattern are spaced apart from each other with the side-capping pattern therebetween.

16. The semiconductor memory device of claim 13, wherein the gate electrode comprises a first electrode and a second electrode which include different materials from each other, wherein the lower portion of the gate electrode comprises the first electrode and a lower portion of the second electrode, and wherein the upper portion of the gate electrode comprises an upper portion of the second electrode.

17. A semiconductor memory device, comprising:

an active pattern on a substrate and at least partially surrounded by a device isolation pattern;

a gate electrode that crosses the active pattern in a first direction parallel to a bottom surface of the substrate, the gate electrode comprising lower and upper portions;

a gate capping pattern on a top surface of the upper portion of the gate electrode; and a side-capping pattern on a side surface of the upper portion of the gate electrode, wherein the gate electrode includes a first conductive material, wherein the side-capping pattern includes a second conductive material, wherein a work function of the second conductive material is greater than a work function of the first conductive material, wherein the side-capping pattern is between the gate capping pattern and the lower portion of the gate electrode, and wherein a top surface of the side-capping pattern is located at a level lower than an uppermost surface of the device isolation pattern, relative to the bottom surface of the substrate where the bottom surface of the substrate is a base reference layer.

18. The semiconductor memory device of claim 17, wherein the side-capping pattern has an outer side surface that is aligned with a side surface of the gate capping pattern in a second direction, and wherein the second direction is parallel to the bottom surface of the substrate and intersects the first direction.

19. The semiconductor memory device of claim 17, wherein the side-capping pattern extends from the gate capping pattern toward the lower portion of the gate electrode along the side surface of the upper portion of the gate electrode.

20. The semiconductor memory device of claim 17, wherein the gate electrode comprises a first electrode and a second electrode which include different materials from each other, wherein the lower portion of the gate electrode comprises the first electrode and a lower portion of the second electrode, and wherein the upper portion of the gate electrode comprises an upper portion of the second electrode.

* * * * *